(12) United States Patent
Shank et al.

(10) Patent No.: US 10,643,927 B1
(45) Date of Patent: May 5, 2020

(54) RING ISOLATED THROUGH-SUBSTRATE VIAS FOR HIGH RESISTIVITY SUBSTRATES

(71) Applicant: GLOBALFOUNDRIES INC., Grand Cayman (KY)

(72) Inventors: Steven Shank, Jericho, VT (US); Ian McCallum-Cook, Burlington, VT (US); John Hall, Glen Allen, VA (US)

(73) Assignee: GLOBALFOUNDRIES INC., Grand Cayman, KY (US)

( * ) Notice: Subject to any disclaimer, the term of this patent is extended or adjusted under 35 U.S.C. 154(b) by 28 days.

(21) Appl. No.: 16/192,999

(22) Filed: Nov. 16, 2018

(51) Int. Cl.
*H01L 23/48* (2006.01)
*H01L 29/06* (2006.01)
*H01L 23/66* (2006.01)
*H01L 21/768* (2006.01)
*H01L 21/764* (2006.01)

(52) U.S. Cl.
CPC .......... *H01L 23/481* (2013.01); *H01L 21/764* (2013.01); *H01L 21/76898* (2013.01); *H01L 23/66* (2013.01); *H01L 29/0649* (2013.01); *H01L 2223/6616* (2013.01)

(58) Field of Classification Search
None
See application file for complete search history.

(56) References Cited

U.S. PATENT DOCUMENTS

| | | | |
|---|---|---|---|
| 7,400,024 B2 | 7/2008 | Kunnen | |
| 7,427,803 B2 | 9/2008 | Chao et al. | |
| 7,816,759 B2 | 10/2010 | Tilke | |
| 9,147,609 B2 | 9/2015 | Jebory et al. | |
| 9,401,323 B1 | 7/2016 | Farooq et al. | |
| 9,570,576 B2 | 2/2017 | Meiser et al. | |
| 9,577,035 B2 | 2/2017 | Hurwitz et al. | |
| 2008/0237729 A1 | 10/2008 | Vandentop et al. | |
| 2012/0049318 A1* | 3/2012 | Kawamata | H01L 21/76232 257/508 |
| 2012/0091593 A1 | 4/2012 | Cheng et al. | |
| 2012/0139127 A1 | 6/2012 | Beyne | |
| 2013/0106528 A1* | 5/2013 | Christian | H05K 1/0251 333/33 |
| 2013/0313682 A1 | 11/2013 | Jebory et al. | |
| 2014/0054743 A1* | 2/2014 | Hurwitz | H01L 29/0642 257/508 |
| 2014/0357050 A1 | 12/2014 | Feng et al. | |
| 2017/0256442 A1* | 9/2017 | Kweskin | H01L 21/76254 |

OTHER PUBLICATIONS

Hashimoto, Takashi, "A Study on Suppressing Crosstalk Through a Thick SOI Substrate and Deep Trench Isolation"; Journal of the Electron Devices Society, vol. 1, No. 7, Jul. 2013 pp. 155-161.

* cited by examiner

*Primary Examiner* — Jay C Chang
(74) *Attorney, Agent, or Firm* — Anthony Canale; Hoffman Warnick LLC

(57) ABSTRACT

Through-substrate vias (TSVs) extend through a high resistivity semiconductor substrate laterally spaced and isolated from an active device formed over the substrate by deep trench isolation (DTI) structures. The deep trench isolation structures may extend partially or entirely through the substrate, and may include an air gap. The deep trench isolation structures entirely surround the active device and the TSVs.

19 Claims, 21 Drawing Sheets

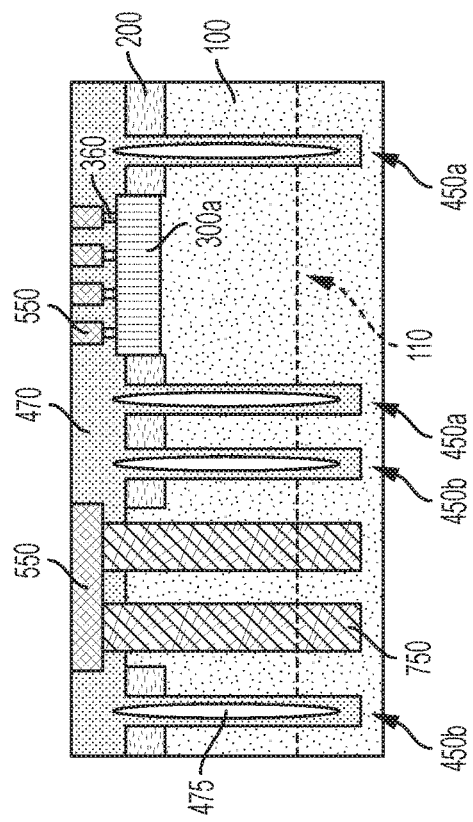
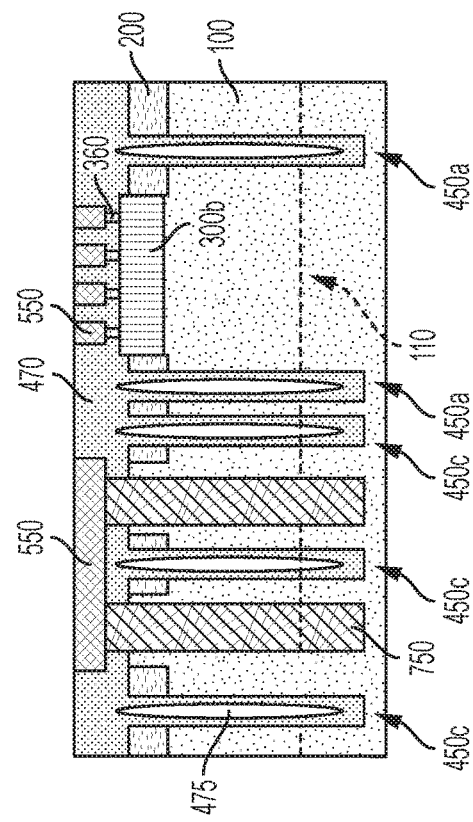
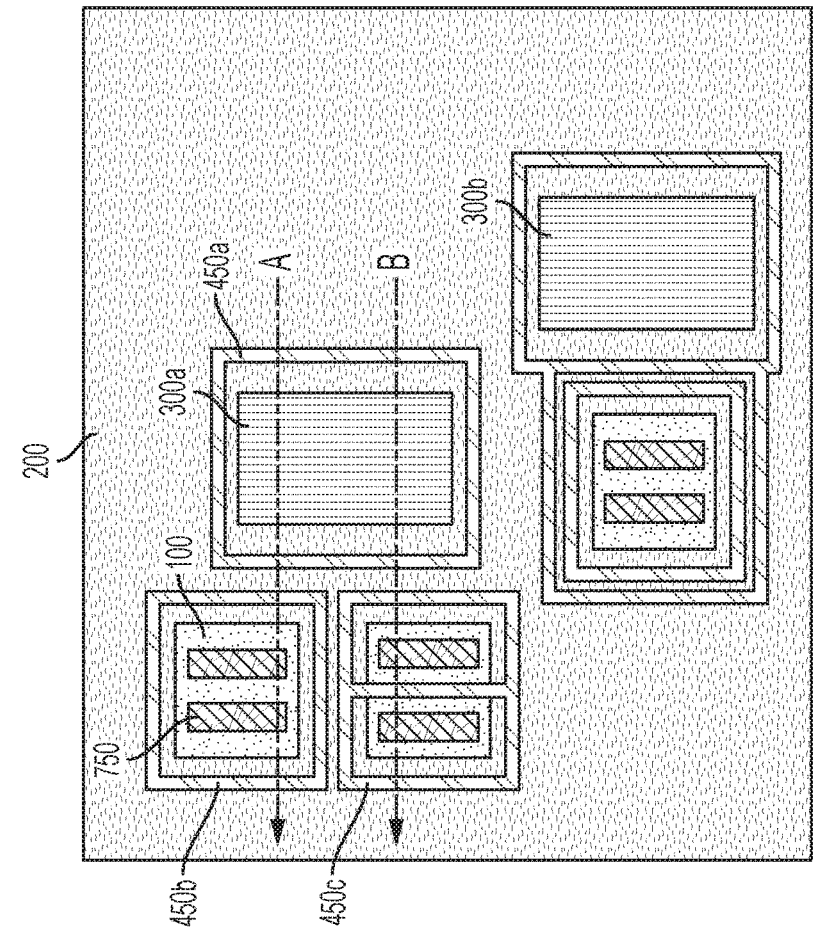

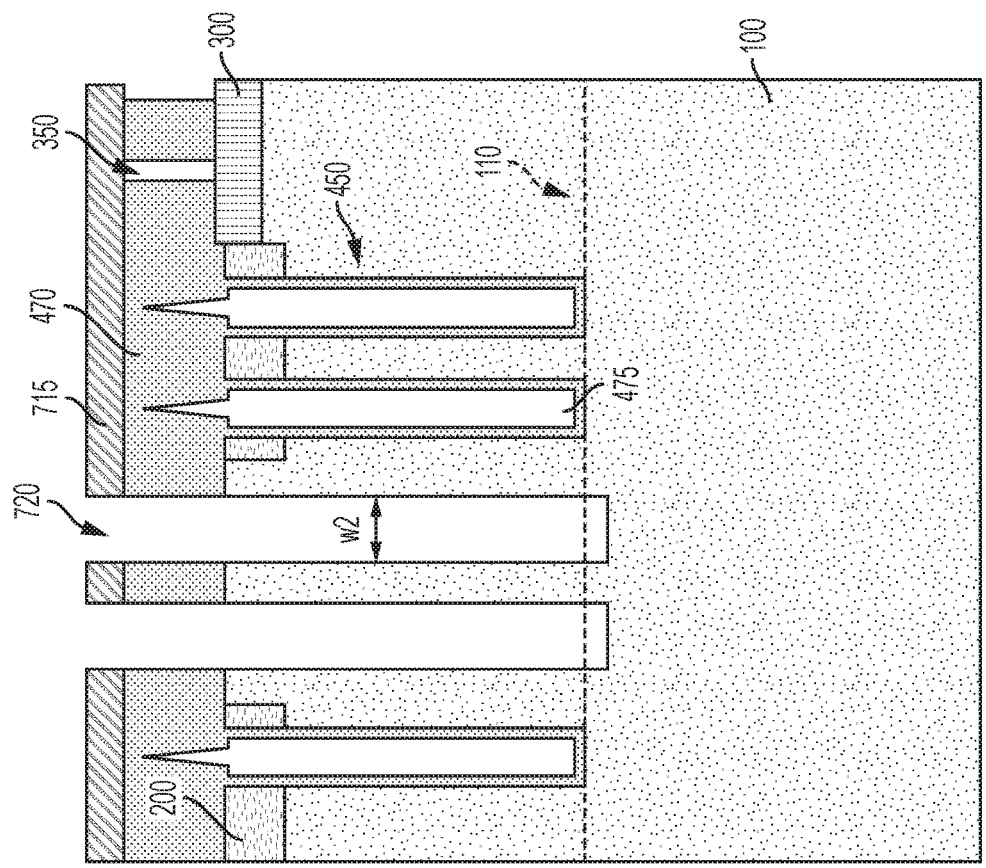
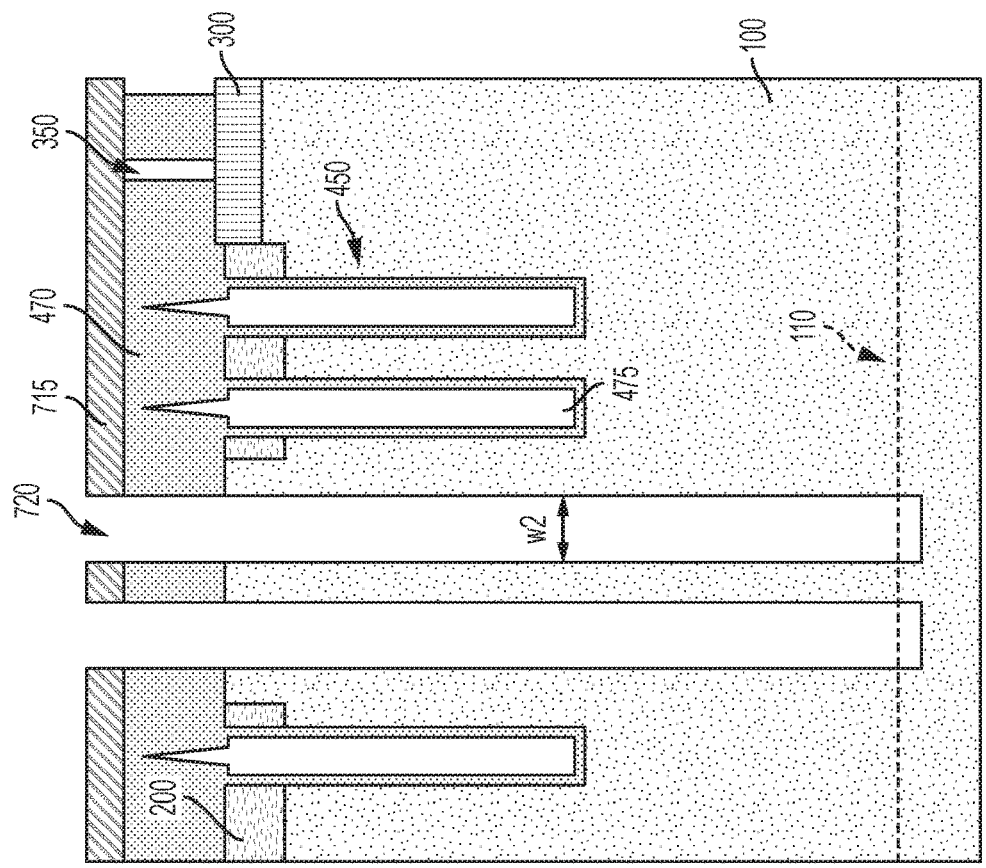

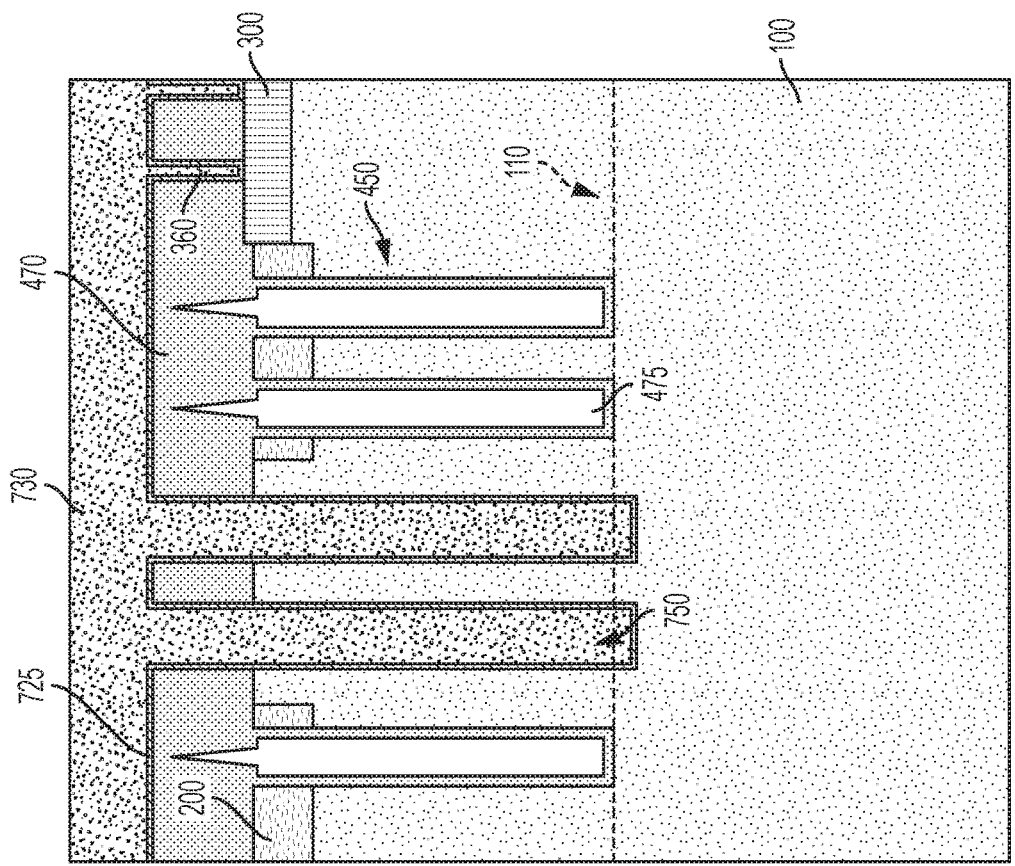
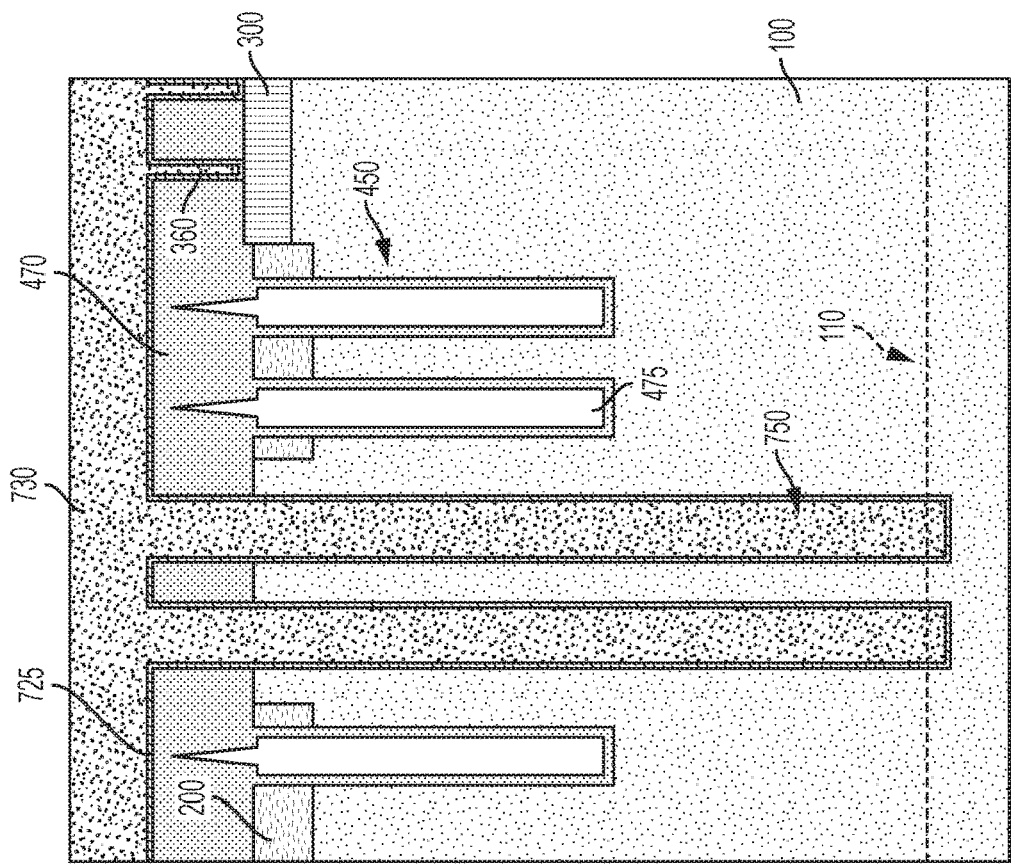
FIG. 11A
FIG. 11B

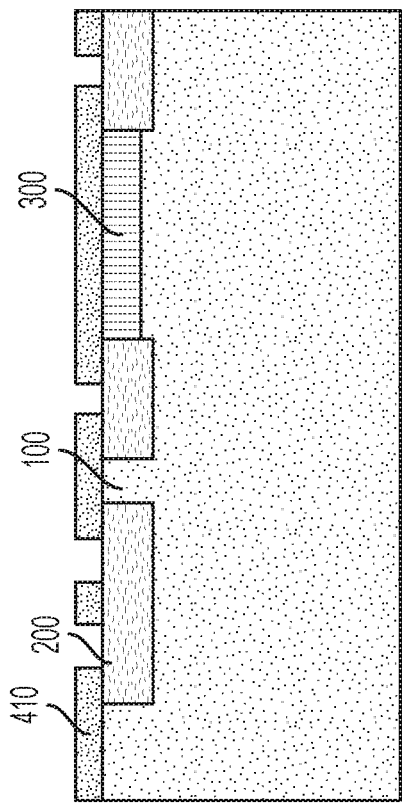
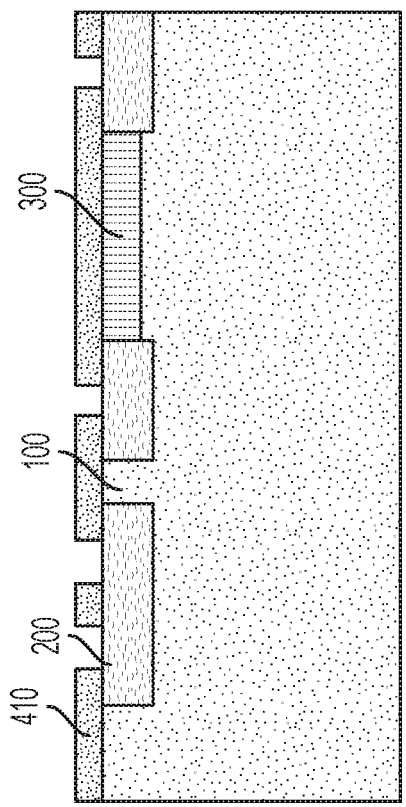
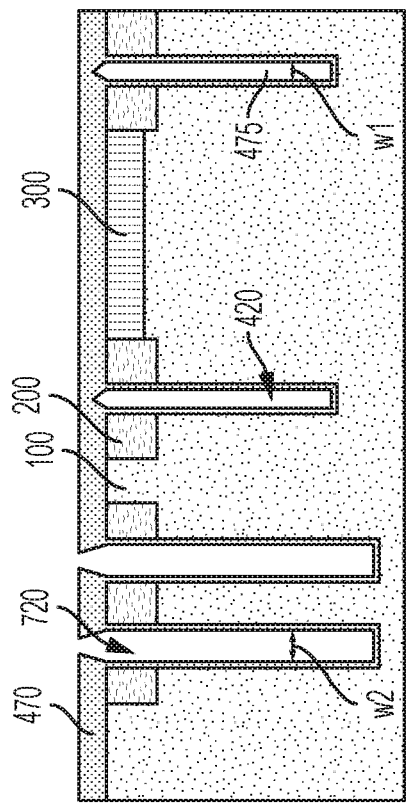
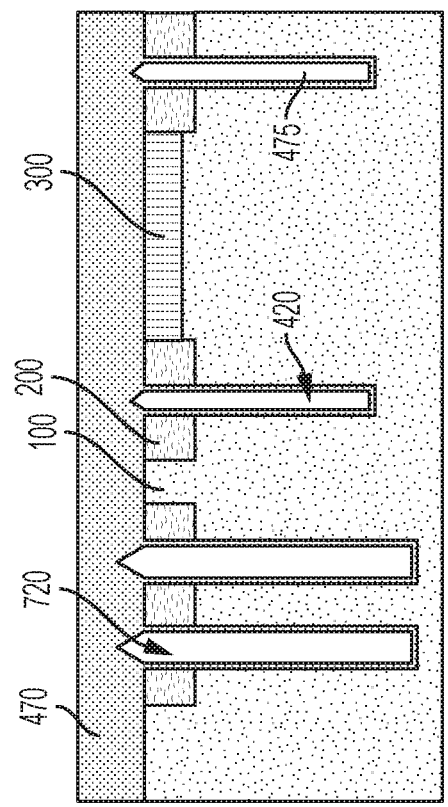

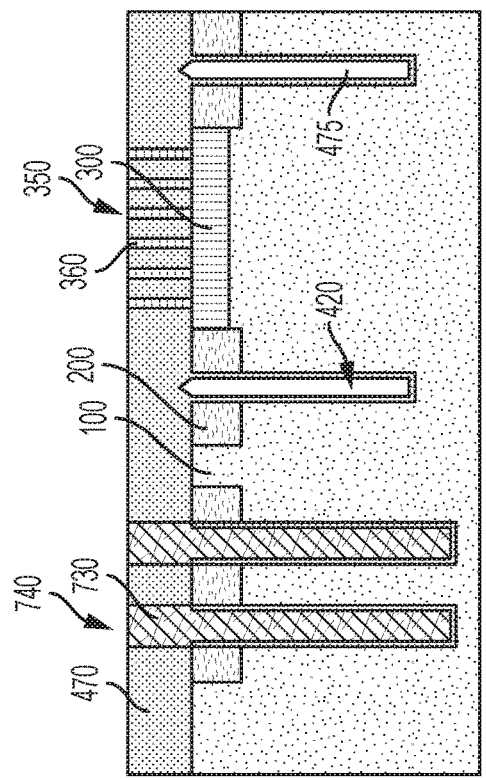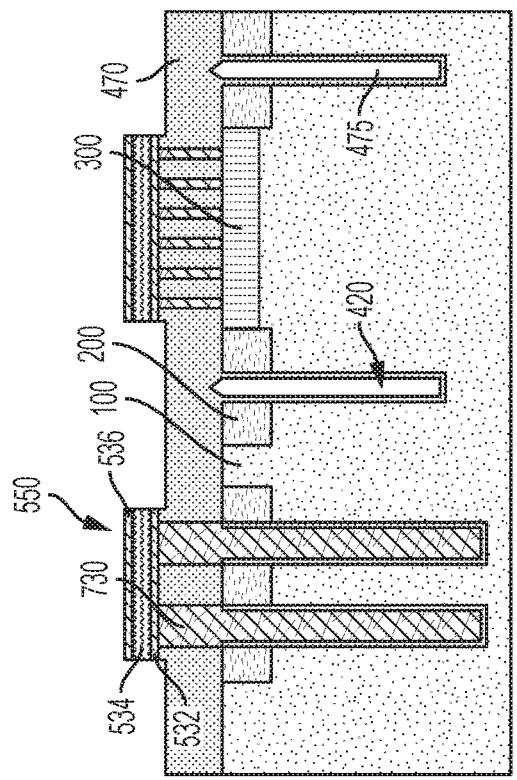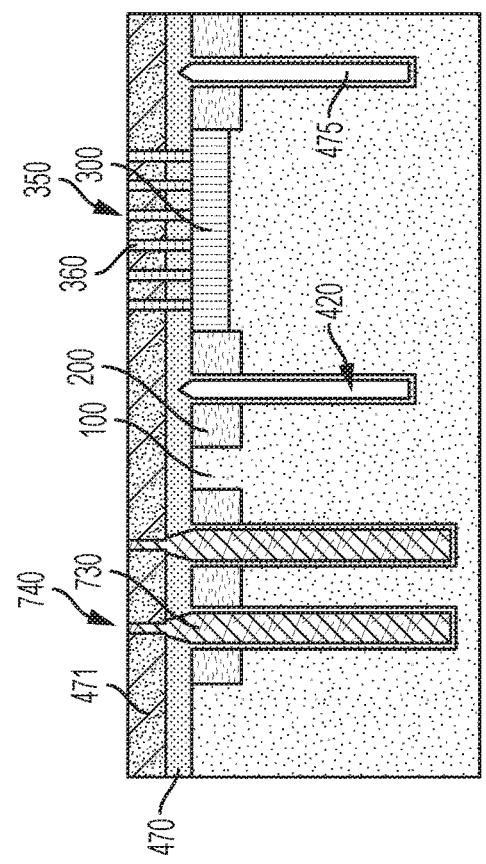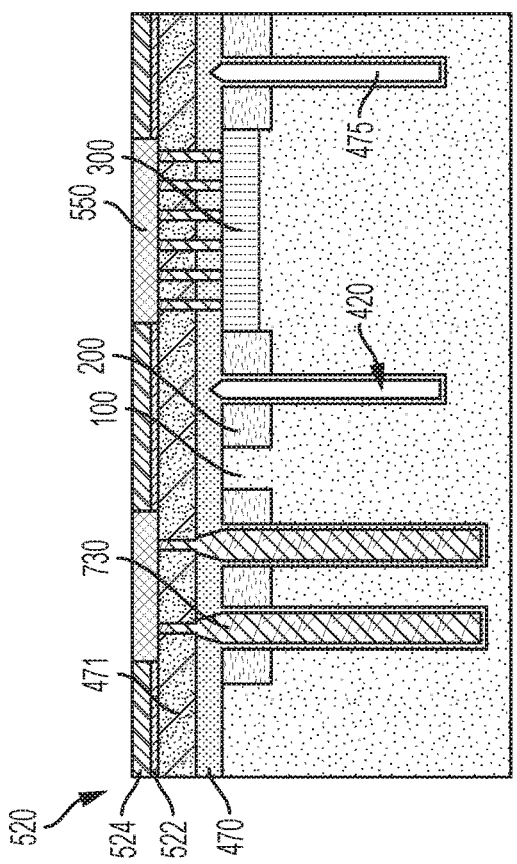

RING ISOLATED THROUGH-SUBSTRATE VIAS FOR HIGH RESISTIVITY SUBSTRATES

BACKGROUND

The present disclosure relates generally to semiconductor devices, and more specifically to isolation structures for semiconductor devices such as radio frequency (RF) devices.

Wireless communications use an antenna to transmit and receive electromagnetic (EM) signals. The antenna is typically driven by an integrated circuit (IC) or other discrete device. This IC or driver chip may be configured within a package on a printed circuit (PC) board, for example, along with other circuitry. The EM signal from the driver chip reaches the antenna via internal wiring or other metallization.

There is an increasing demand for compact radio communications systems having integrated transmitter, receiver, transceiver and antenna systems, which enable high data transmission rates, high volume, low power consumption, low weight, and low cost. As operating frequencies increase, however, the manufacture and assembly of such systems becomes increasingly difficult due to the requirements for isolation and scaling.

Radio frequency devices, including devices operating at 10 GHz and greater, are beneficially integrated directly onto a semiconductor substrate such as a silicon or silicon germanium substrate. In such RF devices, through-substrate vias (TSVs) may be used as an alternative to wire-bond and flip chip technologies to create 3D packages and 3D integrated circuits.

As will be appreciated, high resistivity substrates (>1000 ohm-cm) that enable improved RF performance are susceptible to large depletion regions at typical well biases. To prevent leakage currents from flowing from a device to a through-substrate via (TSV), for example, it has been shown that spacing ground rules greater than the depletion region itself are required, which is adverse to technology scaling requirements.

Notwithstanding recent advances, the development of chip architectures that provide adequate isolation while satisfying next-generation device-to-TSV spacing ground rule requirements would be beneficial.

SUMMARY

As described in further detail herein, device-to-TSV spacing ground rule requirements for active devices formed over high-resistivity (HIRES) semiconductor substrates can be met by surrounding active device regions and TSVs with deep trench isolation (DTI) structures such that junction depletions terminate at the DTIs. Different isolation architectures suitable for RF chip manufacturing are provided for different substrate thicknesses. Furthermore, the various isolation approaches described herein decrease sensitivity to incoming substrate doping resistivity variability as well as backside grind tolerances for aggressively thinned substrates. Various methods enable the co-integration of through-substrate vias and deep trench isolation (DTI) structures within a single semiconductor substrate.

In accordance with embodiments of the present disclosure, a semiconductor chip includes a high resistivity semiconductor substrate, an electronic device formed over a front side of the substrate, a through-substrate via (TSV) laterally spaced from the electronic device, a first deep trench isolation structure extending at least partially into the substrate and laterally spaced from and surrounding the electronic device, a second deep trench isolation structure extending at least partially into the substrate and laterally spaced from and surrounding the through-substrate via.

A method of forming a semiconductor chip includes forming an electronic device over a front side of a high resistivity semiconductor substrate, forming a deep trench isolation structure extending at least partially through the substrate and laterally spaced from and surrounding the electronic device, and forming a through-substrate via laterally spaced from the electronic device. A deep trench isolation structure can also surround the through-substrate via.

BRIEF DESCRIPTION OF SEVERAL VIEWS OF THE DRAWINGS

The following detailed description of specific embodiments of the present disclosure can be best understood when read in conjunction with the following drawings, where like structure is indicated with like reference numerals and in which:

FIG. 3 shows a top-down plan view of an example device layout, including deep trench isolation structures laterally spaced from and surrounding active device regions and laterally spaced from and surrounding plural TSVs;

FIG. 3A is a cross-sectional view of an isolation architecture including through-substrate vias and deep trench isolation structures disposed adjacent to an electronic device formed over a high resistivity substrate according to various embodiments;

FIG. 3B is a cross-sectional view of an isolation architecture including through-substrate vias and deep trench isolation structures disposed adjacent to an electronic device formed over a high resistivity substrate according to further embodiments;

FIG. 9A shows the formation of a further hard mask over the dielectric layer and etching of the substrate to form through-substrate via openings according to one embodiment;

FIG. 9B shows the formation of a further hard mask over the dielectric layer and etching of the substrate to form through-substrate via openings according to a further embodiment;

FIG. 11A shows metallization of the device contact openings and the through-substrate via openings according to one embodiment;

FIG. 11B shows metallization of the device contact openings and the through-substrate via openings according to a further embodiment;

FIG. 16A shows an electronic device disposed over a HIRES semiconductor substrate and the formation and patterning of a hard mask over the substrate according to one embodiment;

FIG. 16B shows an electronic device disposed over a HIRES semiconductor substrate and the formation and patterning of a hard mask over the substrate according to a further embodiment;

FIG. 17A depicts the simultaneous formation of trench openings and through-substrate via openings through STI and into the substrate, and the formation of a conformal liner within both the trench openings and the through-substrate via openings and the attendant pinch off of the liner over the trench openings;

FIG. 17B depicts the simultaneous formation of trench openings and through-substrate via openings through STI and into the substrate, and the formation of a conformal liner within both the trench openings and the through-substrate via openings and the attendant pinch off of the liner over both the trench openings and the through-substrate via openings;

FIG. 20A shows the formation of openings through the contact level dielectric layer followed by metallization of the through-substrate vias and the device contact openings, and planarization of the structure according to certain embodiments;

FIG. 20B shows the formation of openings through the contact level dielectric layer followed by metallization of the through-substrate vias and the device contact openings, and planarization of the structure according to further embodiments;

FIG. 21A depicts the formation of a back-end-of-the-line (BEOL) wiring architecture including copper metal over a dual-contact level dielectric architecture; and FIG. 21B depicts the formation of a back-end-of-the-line (BEOL) wiring architecture including aluminum metal over a single-contact level dielectric architecture.

DETAILED DESCRIPTION

Figure 1:
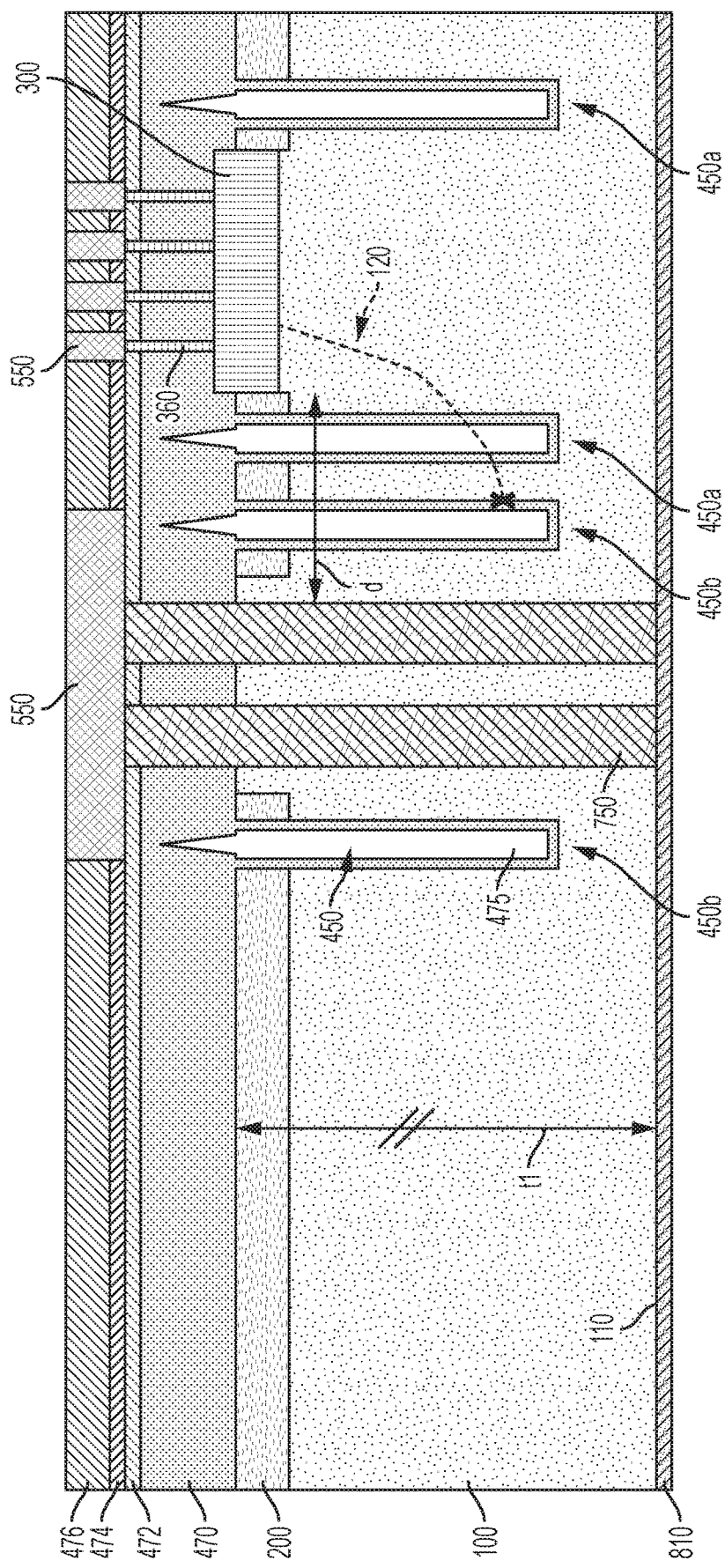
FIG. 1 is a cross-sectional diagram showing a device active region disposed over an upper surface of a semiconductor substrate, through-substrate vias spaced laterally from the device active region, deep trench isolation structures laterally spaced from and surrounding the device active region and laterally spaced from and surrounding the through-substrate vias, and a metallization layer disposed over a backside surface of the semiconductor substrate in electrical contact with the through-substrate vias.

Reference will now be made in greater detail to various embodiments of the subject matter of the present invention, some embodiments of which are illustrated in the accompanying drawings. The same reference numerals will be used throughout the drawings to refer to the same or similar parts.

Disclosed are semiconductor chip architectures and methods of manufacturing semiconductor chips, including semiconductor chips particularly suited for RF applications. Example chip architectures are formed on a high resistivity (HIRES) semiconductor substrate. The chip architectures include an active device region and one or more deep trench isolation (DTI) structures located peripheral to the active device region. In addition, through-substrate vias (TSVs) are formed in the substrate. The TSVs are isolated from the active device region by one or more deep trench isolation (DTI) structures, which surround the TSVs. By isolating the TSVs from the active device region, a compact device layout can be achieved while avoiding depletion of mobile charge carriers.

In certain embodiments, one or more deep trench isolation (DTI) structures surround an active device region that is formed over a front side of a high resistivity substrate. In various embodiments, one or more deep trench isolation (DTI) structures surround an active device region while additional deep trench isolation (DTI) structures surround through-substrate vias (TSVs). The TSVs may be metallized and may optionally include a dielectric liner between the substrate and the metallization. The deep trench isolation (DTI) structures may extend partially or entirely through the substrate and, as described further herein, may include an air gap. Openings for the deep trench isolation structures and openings for the through-substrate vias may be formed using successive etch processes or a common etch process, e.g., the trench and via openings may be formed simultaneously using a single lithography mask.

A metallization layer may be formed over a backside of the substrate, and configured to be in electrical contact with the TSVs, e.g., to form a ground plane. The backside metallization layer may also function as a heat sink. In certain embodiments, a passivation layer may be formed over the backside of the substrate prior to forming the metallization layer. In chip architectures constructed on thin HIRES substrates, for example, the passivation layer may inhibit carrier depletion to the substrate backside.

In certain embodiments, the passivation layer includes a self-planarizing dielectric layer such as a spin-on glass, and is configured to allow heat conduction therethrough, i.e., from the substrate to the backside metallization layer. In further embodiments, the passivation layer is adapted to induce a stress profile to the substrate to produce a flat or nearly flat substrate, e.g., following a de-bonding operation.

Figure 2:
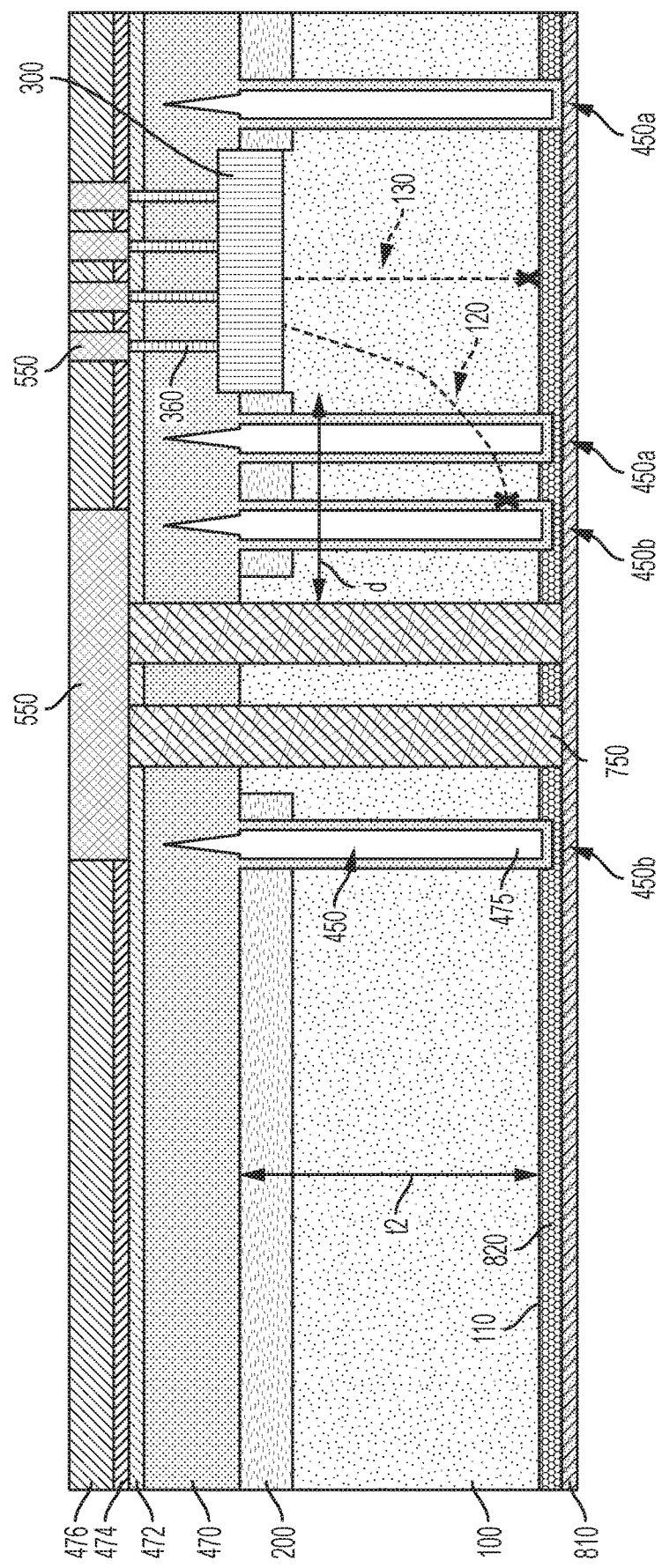
FIG. 2 is a cross-sectional diagram according to further embodiments showing a device active region disposed over an upper surface of a semiconductor substrate, through-substrate vias spaced laterally from the device active region, deep trench isolation structures laterally spaced from and surrounding the device active region and laterally spaced from and surrounding the through-substrate vias and extending entirely through the substrate, a passivation layer disposed over a backside surface of the substrate, and a metallization layer disposed over the passivation layer and in electrical contact with the through-substrate vias.

Example semiconductor chip architectures that include DTI ring-isolated TSVs are shown in FIGS. 1-3. Methods of forming exemplary chip architectures including ring-isolated TSVs are described with reference to FIGS. 4-21. A first embodiment related to the co-integration of DTI and TSV structures is described in connection with FIGS. 4-15, and further embodiments are described in connection with FIGS. 16-21. For instance, FIGS. 16A-21A illustrate a copper-enabled process flow including a dual contact level dielectric layer, while FIGS. 16B-21B illustrate a process flow including a single contact level dielectric layer suitable for aluminum contacts.

Referring to FIG. 1, an electronic device 300 is formed over a semiconductor substrate 100 and is surrounded laterally by a shallow trench isolation (STI) layer 200. Following a backside grinding step, semiconductor substrate 100 may have a thickness, t1, where t1 is greater than 150 microns. A plurality of deep trench isolation (DTI) structures 450 extend through the STI layer 200 and partially into the substrate 100. First DTI structure 450a is located laterally spaced from and surrounding device 300, and second DTI structure 450b is arranged laterally spaced from and surrounding a pair of through-substrate vias 750, which are laterally spaced from the device 300. In the illustrated embodiment, DTI structures 450a, 450b include an air gap 475. A metallization layer 810 is formed over a backside of the substrate 100, and in electrical contact with the through-substrate vias 750.

Over a front side of the substrate 100, conductive contacts 360 extend through a contact level dielectric layer 470 that is disposed over the device 300 and over the STI layer 200 and are in electrical contact with device 300. The contact level dielectric layer 470 is also conformally disposed over sidewalls of the deep trench isolation structures 450.

A metallization architecture, which may include a plurality of metal lines 550, is disposed within contact level dielectric layer 470 and ILD layers 472, 474, 476. Various metal lines 550 are independently in electrical contact with conductive contacts 360 and through-substrate vias 750.

With reference to FIG. 2, according to further embodiments, a plurality of deep trench isolation (DTI) structures 450 extend through STI layer 200 and entirely through semiconductor substrate 100, which has a post-grinding thickness, t2, of 50 to 100 microns, for example. As in the embodiment of FIG. 1, a first DTI structure 450a is laterally spaced from and surrounding electronic device 300, while a second DTI structure 450b is laterally spaced from and surrounding a pair of through-substrate vias 750. In the embodiment of FIG. 2, a passivation layer 820 is formed over the backside of the substrate 100 and metallization layer 810 is formed over the passivation layer 820. Passivation layer 820 is disposed directly over bottom surfaces of the first and second DTI structures 450a, 450b, while metallization layer 810 is formed directly over, and in electrical contact with the TSVs 750. According to certain embodiments as illustrated in FIGS. 1 and 2, a spacing (d) between an electronic device 300 and an adjacent TSV may be less than 25 microns.

During operation of device 300, first DTI structure 450a and/or second DTI structure 450b are configured to block leakage current emanating from the device 300 and prevent carrier depletion from active device regions, such as device wells, source/drain regions or junction regions (not separately shown). The current path 120 associated with a depletion-to-DTI loop is shown schematically in FIGS. 1 and 2. In FIGS. 1 and 2, the current flow between device 300 and TSVs 750 is arrested by second DTI structure 450b. Additionally, in FIG. 2, with reference to current path 130, the current flow between device 300 and backside metallization 810 is arrested by passivation layer 820.

An exemplary device layout at an intermediate stage of fabrication is shown in FIG. 3, i.e., prior to a backside grinding step that removes a portion of the backside of the substrate 100 to reveal the TSV structures 750. FIG. 3 is a top down plan view of the layout, while FIG. 3A is a cross-sectional view of the FIG. 3 structure along line A, and FIG. 3B is a cross-sectional view of the FIG. 3 structure along line B. A backside grind interface 110 is shown in each of FIGS. 3A and 3B. Backside grind interface 110 identifies the extent of substrate removal to be performed by the grinding step.

Referring to FIG. 3, and in conjunction with FIG. 3A, a first DTI structure 450a is formed through STI layer 200 and is laterally spaced from and extends entirely around a first device 300a, while a second DTI structure 450b is laterally spaced from and is formed around a pair of TSVs 750 that are spaced away from the first device 300a.

Referring to FIG. 3, and in conjunction with FIG. 3B, a third DTI structure 450c is formed around a second pair of TSVs 750, where a portion of the third DTI structure 450c also extends between respective ones of the second pair of TSVs. Thus, a DTI structure can surround an individual TSV or multiple TSVs. Furthermore, plural DTI structures 450 may be arranged such that two or more DTI structure are laterally spaced from, but surround, e.g., completely surround, electronic device 300. With reference still to FIG. 3, for instance, a pair DTI structures is laterally spaced from and surrounding a pair of TSVs. A portion of one of the DTI structures surrounding the TSVs is contiguous with a portion of one of the DTI structures that surrounds second device 300b. In the illustrated embodiments, each TSV 750 extends into the substrate 100 and is laterally displaced from STI layer 200.

Figure 4:
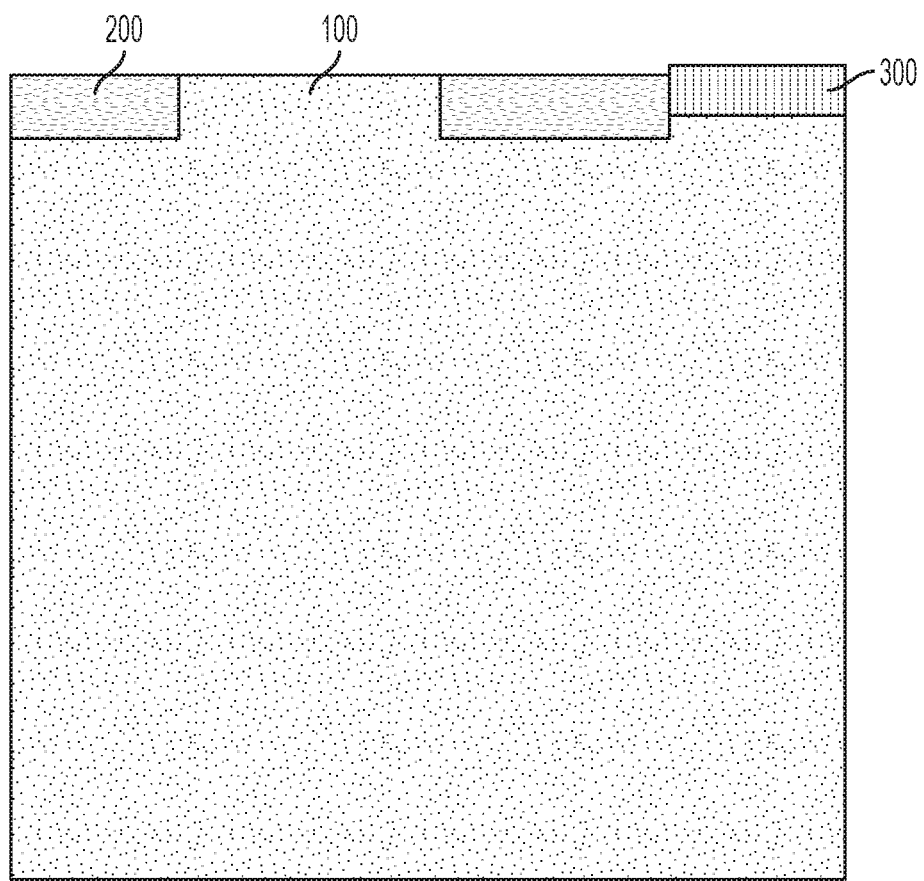
FIG. 4 is a cross-sectional diagram showing the formation of a shallow trench isolation (STI) layer within a bulk HIRES semiconductor substrate, and the formation of an exemplary electronic device laterally adjacent to the STI layer.

Referring to FIG. 4, shown is a simplified cross-sectional view of a chip architecture at a preliminary stage of fabrication according to various embodiments. The chip architecture includes a bulk high-resistivity (HIRES) semiconductor substrate 100, a shallow trench isolation (STI) layer 200 formed within upper regions of the substrate, and an electronic device 300 formed over the substrate and adjacent to a shallow trench isolation layer 200. The STI layer 200 may be located peripheral to the electronic device 300.

Device 300 may include an active or passive circuit, such as a transistor, capacitor, resistor, and the like and, in the example of a transistor such as a field effect transistor, may include conventional device elements such as gate structures that overlie well regions within an active device area (not separately shown). Device 300 may include an array of n-type transistors, for example, configured to operate as an RF switch. Methods of forming various electronic devices 300, including fin field effect transistors (FinFETs) are readily known to those skilled in the art.

According to various embodiments, the semiconductor substrate 100 is a bulk substrate, and may include any suitable semiconductor material. For instance, semiconductor substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof.

The substrate 100 is not limited to silicon-containing materials, however, as the substrate 100 may include other semiconductor materials, including Ge and compound semiconductors, including III-V compound semiconductors such as GaN, GaP, GaAs, InAs and InSb, and II-VI compound semiconductors such as CdSe, CdS, CdTe, ZnSe, ZnS and ZnTe.

As used herein, the term "single crystal" denotes a crystalline solid in which the crystal lattice of the entire solid is substantially continuous and substantially unbroken to the edges of the solid with substantially no grain boundaries. The semiconductor substrate 100 may be a (100)-oriented silicon wafer or a (111)-oriented silicon wafer, for example. According to various embodiments, portions of the semiconductor substrate may be amorphous, polycrystalline, or single crystalline.

Substrate 100 may have dimensions as typically used in the art and may include, for example, a semiconductor wafer. Example wafer diameters include, but are not limited to, 50, 100, 150, 200, 300 and 450 mm. The total substrate thickness may range from 50 microns to 1500 microns, although in particular embodiments the substrate thickness is initially in the range of 725 to 775 microns, i.e., prior to backside grinding, which corresponds to thickness dimensions commonly used in silicon CMOS processing. As described further here, a grinding operation may be used to remove material from the backside of the substrate 100 and correspondingly decrease the substrate thickness.

In certain embodiments, the semiconductor substrate 100 may be a high resistivity substrate or an ultra-high resistivity substrate. As used herein, a "high resistivity" substrate has a bulk resistivity of greater than 1000 ohm-cm, while an "ultra-high resistivity" substrate has a bulk resistivity of greater than 5000 ohm-cm.

Prior to formation of electronic device 300, a shallow trench isolation layer 200 may be formed in an upper region of the substrate 100. The shallow trench isolation (STI) layer 200 may be used to provide electrical isolation between the adjacent devices 300 as is needed for the circuit(s) being fabricated. An example STI process involves creating isolation trenches in the semiconductor substrate 100 through an anisotropic etch process. The isolation trench may have a relatively low aspect ratio (e.g., ratio of the depth of the isolation trench to its width).

A dielectric fill material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure.

"Planarization" and "planarize" as used herein refer to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Figure 5:
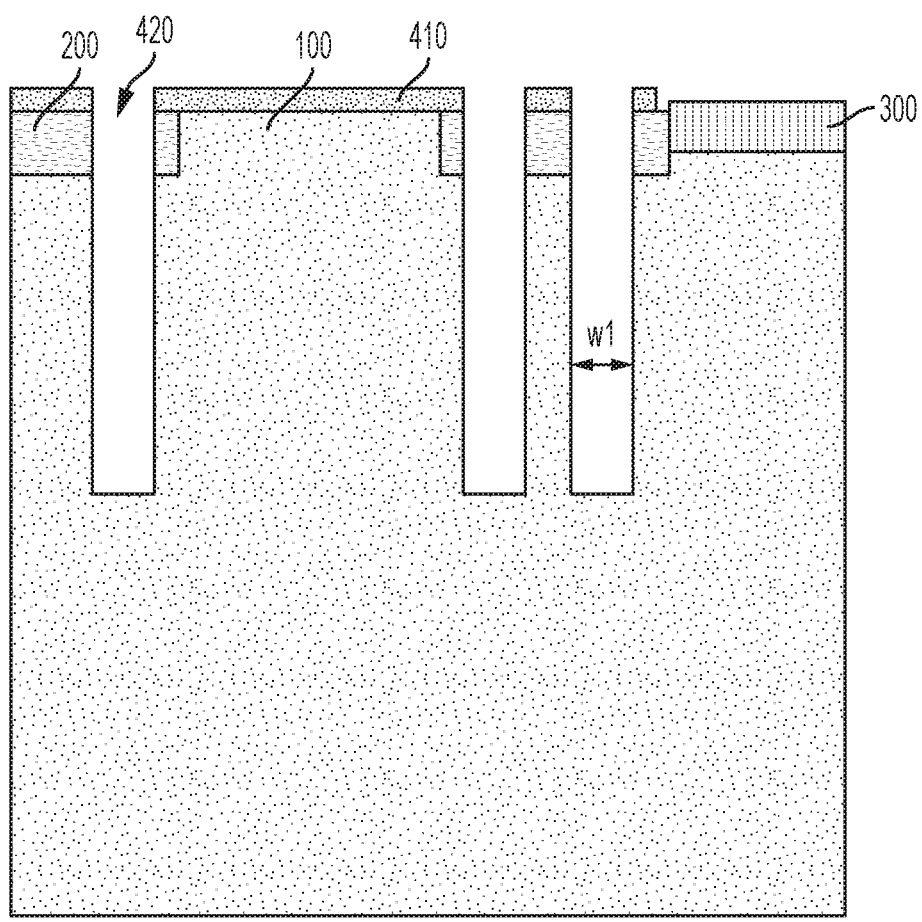
FIG. 5 shows the formation of trench openings through the STI layer and into the substrate.

Referring to FIG. 5, deep trench isolation (DTI) openings 420 are formed through the STI layer 200 and into the substrate 100. To form deep trench isolation openings 420, a hard mask 410 is formed over the substrate 100, including STI layer 200, and over device 300 and, using conventional photolithography and etching techniques, the hard mask 410 is patterned to form openings that extend through the hard mask. As seen with reference to FIG. 5, the openings in the hard mask 410 completely overlie STI layer 200.

Hard mask 410 may include a nitride layer, an oxide layer, an oxynitride layer, or a combination of layers (not separately shown). For example, a multi-layer hard mask 410 may include a first oxide layer deposited directly over the substrate 100 and STI layer 200, a nitride layer deposited over the first oxide layer, and a second oxide layer deposited over the nitride layer. In certain embodiments, hard mask 410 may be replaced by a soft mask, e.g., a layer of positive or negative photoresist.

Following patterning of the hard mask 410, the STI layer 200 and substrate 100 are etched through the openings in the hard mask 410 to form a number of trench openings 420 that extend through the STI layer 200 and into the substrate 100. In certain embodiments, the etch process to form the trench openings 420 may be a substantially anisotropic etch process, such as a deep reactive ion etch (RIE), and may include one or more etch steps. For instance, a first etch step utilizing a first etch chemistry may be used to etch portions of the STI layer 200 unblocked by hard mask 410, and a second etch step utilizing a second etch chemistry may be used to etch the substrate 100.

The trench openings 420 can have a range of widths and depths. For instance, each trench opening 420 may have a width (w1) of 0.5 to 2 microns, e.g., 0.5, 1, 1.5 or 2 microns, including ranges between any of the foregoing values, and a depth of 50 to 200 microns, e.g., 50, 75, 100, 125, 150, 175 or 200 microns, including ranges between any of the foregoing values, although deeper trench openings are contemplated.

In various embodiments, a sidewall angle of the trench openings 420 can range from 80 to 90°, e.g., 80, 85, 88, 89 or 90°, including ranges between any of the foregoing values, where a 90° side wall angle is substantially perpendicular to the top surface of the substrate 100.

Figure 6:
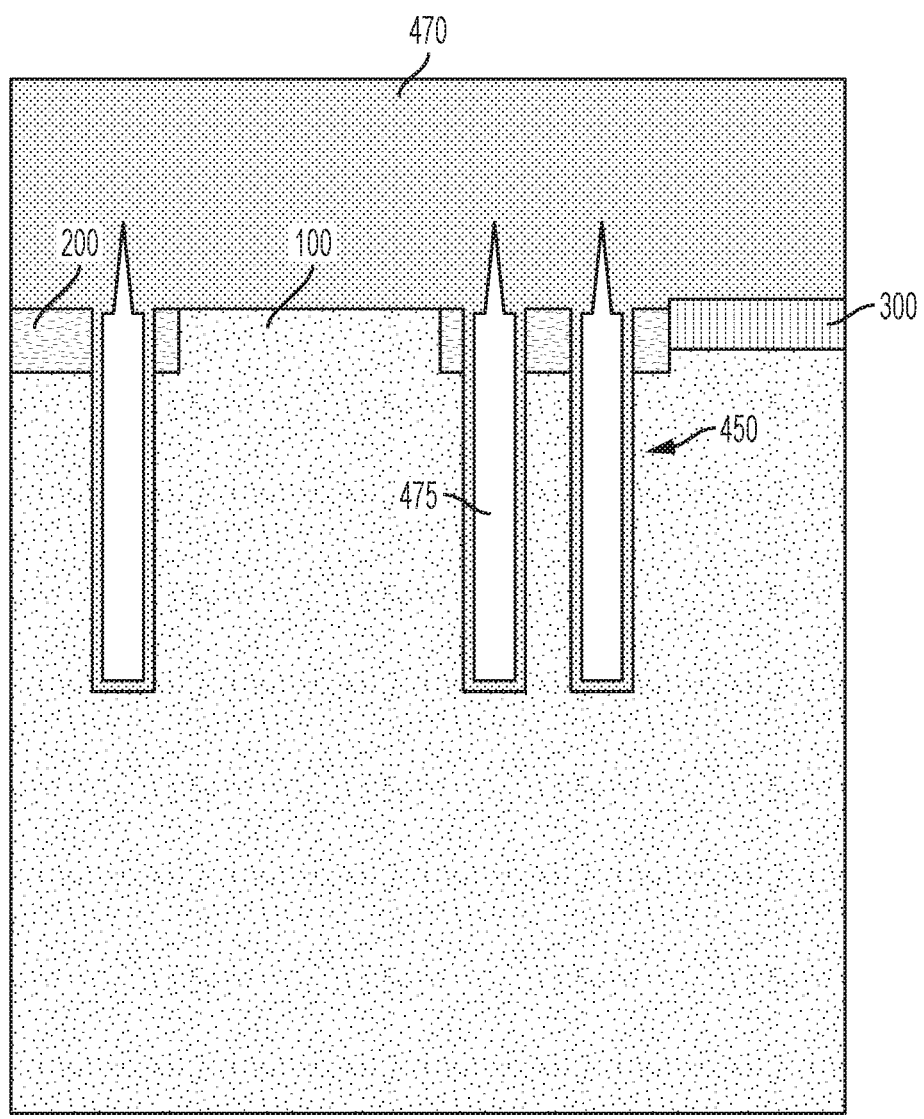
FIG. 6 shows the deposition of a dielectric layer over the substrate and conformally within the trench openings to form deep trench isolation structures laterally spaced from and surrounding the electronic device.

Referring to FIG. 6, after the trench openings 420 have been formed, a contact level dielectric layer 470 is formed over substrate 100, e.g., over STI layer 200 and device 300, and conformally within the trench openings 420 to line the trench openings 420. In certain embodiments, the contact level dielectric layer 470 may pinch off to form an air gap 475 within the trench openings 420 between opposing sidewalls thereof to define DTI structures 450. DTI structures include the contact level dielectric layer 470 and optionally one or more airgaps within the trench openings 420.

The contact level dielectric layer 470 may be formed using chemical vapor deposition (CVD) or atomic layer deposition (ALD), for example, and may include silicon dioxide, or a borophosphosilicate glass (BPSG). A method for forming a BPSG layer by atmospheric pressure chemical vapor deposition (APCVD) uses ozone and TEOS as precursor gases.

Figure 7:
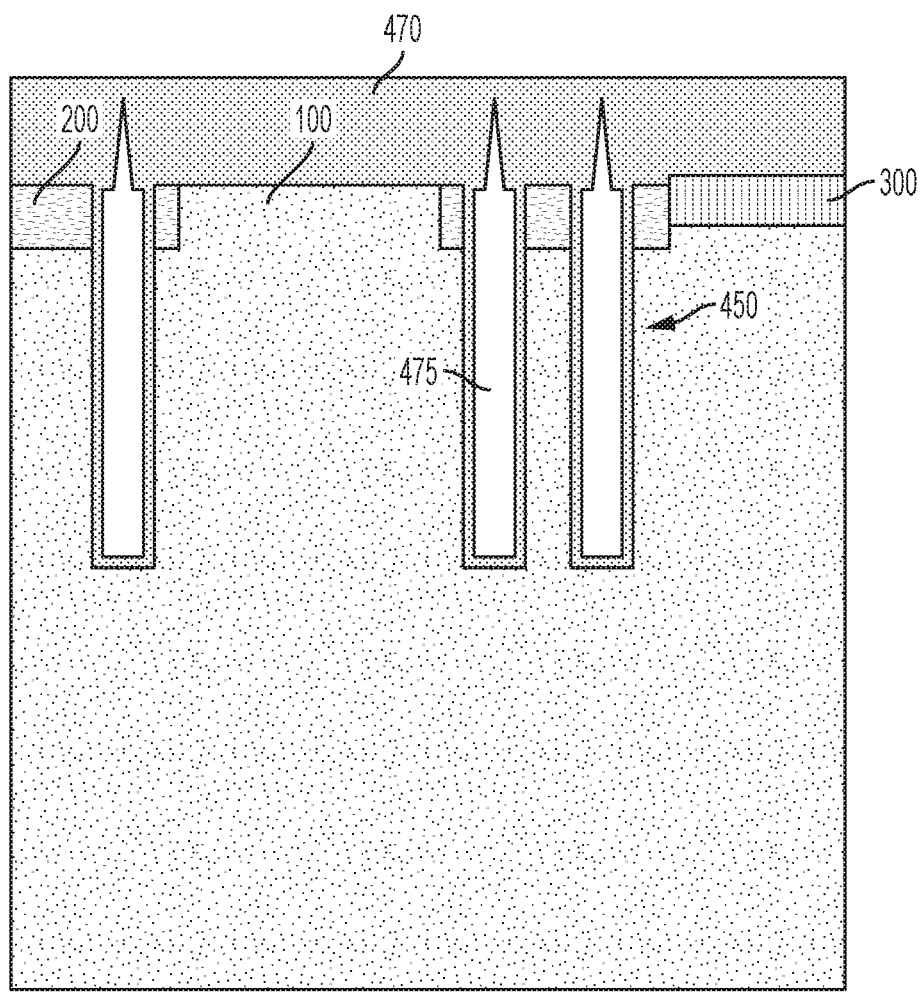
FIG. 7 shows the structure of FIG. 6 following planarization of the dielectric layer.

Thus, DTI structures 450 are formed within DTI trench openings 420, where the trench openings 420 are lined with contact level dielectric layer 470 that is also disposed over the STI layer 200 and device 300. A polishing step, as illustrated in FIG. 7, can be used to planarize a top surface of the structure, without exposing air gaps 475.

Figure 8:
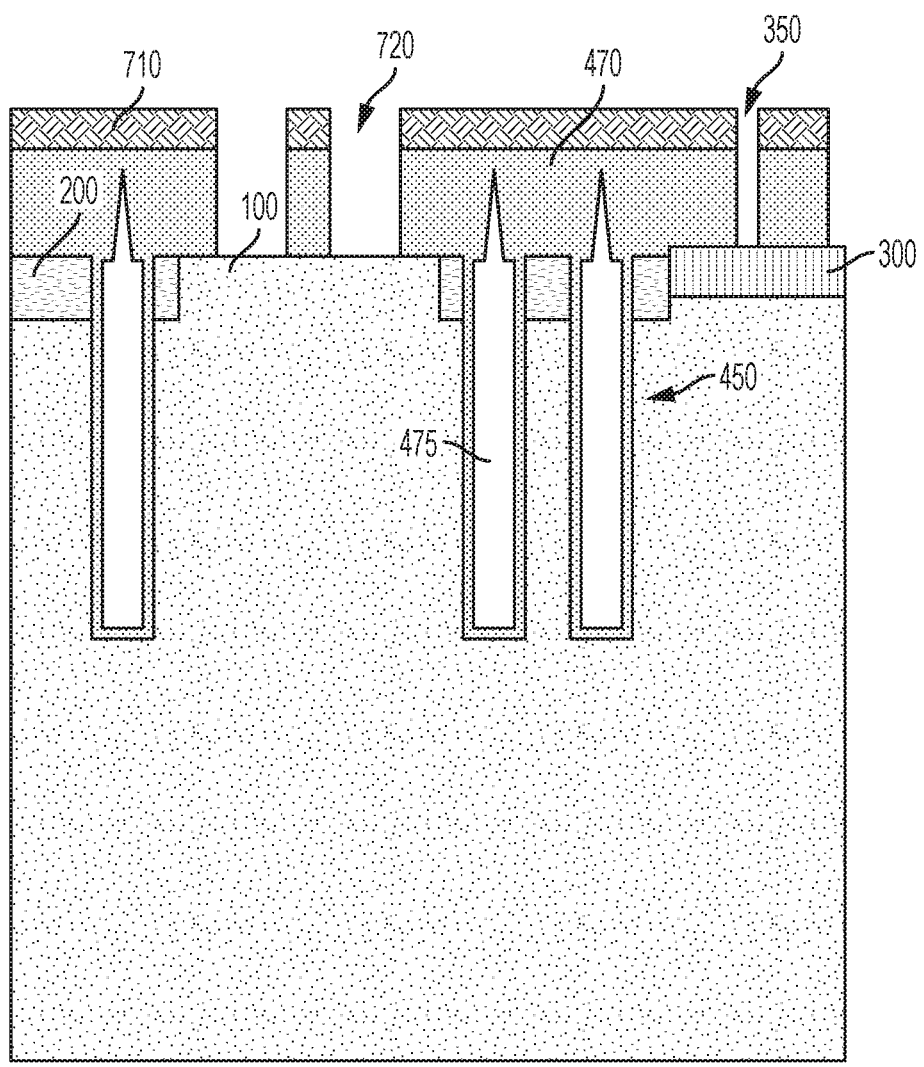
FIG. 8 depicts the formation and patterning of a hard mask over the dielectric layer, followed by etching of the dielectric layer to form device contact openings over the electronic device and through-substrate via openings over the substrate.

Referring to FIG. 8, a hard mask 710 is formed above the contact level dielectric layer 470. Example materials for hard mask 710 include silicon nitride, silicon oxynitride, and the like. Hard mask 710 may be formed using a suitable deposition processes, such as a chemical vapor deposition (CVD) process or a physical vapor deposition (PVD) process, for example.

Thereafter, a patterned photoresist mask layer (not shown) is formed over the hard mask 710 using typical photolithography processes, and the hard mask 710 is etched to provide device contact openings 350 and TSV openings 720 that extend through the contact level dielectric layer 470. Device contact openings 350 are formed over device 300, e.g., over one or more wells between adjacent gate structures, and TSV openings 720 are formed over substrate 100, laterally displaced from STI layer 200, by etching the contact level dielectric layer 470 using the hard mask 710 as an etch mask.

Referring to FIG. 9A and FIG. 9B, hard mask 710 is removed and a further hard mask 715 is formed over contact level dielectric layer 470. The materials and methods used to form hard mask 710 can be used to form hard mask 715. Further hard mask 715 is patterned to re-expose TSV openings 720 that extend into the contact level dielectric layer 470 and block device contact openings 350 over device 300.

Using further hard mask 715 as an etch mask, a further etch process is performed to extend TSV openings 720 into the substrate 100. In the embodiments illustrated in FIGS. 9A and 9B, the depth of TSV openings 720 within substrate 100 exceeds the depth of adjacent DTI structures 450. Typically, and as shown in FIGS. 9A and 9B, at this stage of fabrication, the TSV openings 720 do not extend through the entire thickness of the substrate 100, but stop short of the substrate back surface. For example, in some embodiments, the etch process used to define TSV openings is continued until the bottom surface of the TSV openings 720 is within about 1 to 20 microns of the back surface of the substrate 100.

In the embodiments of FIG. 9A and FIG. 9B, a bottom of the TSV openings 720 lies below the backside grind interface 110, such that a backside grinding step will expose the TSVs. In the embodiment of FIG. 9A, a bottom surface of the DTI structures 450 is positioned above the backside grind interface 110, while in the embodiment of FIG. 9B, a bottom surface of the DTI structures 450 is positioned proximate to the backside grind interface 110.

Depending on the overall processing and chip design parameters, TSV openings 720 may have a width dimension (w2) ranging from 1-10 µm, a depth dimension ranging from 5-200 µm or more, and an aspect ratio, i.e., depth-to-width ratio, ranging from 4 to 40. In one embodiment, the width dimension (w2) may be about 5 microns and the depth dimension may be about 50 microns.

Depending on the chip design considerations and etch parameters employed during the etch process to form TSV openings, sidewalls of the TSV openings 720 may be substantially vertical with respect to the front and back surfaces the substrate, whereas in some embodiments the sidewalls may be tapered. In various embodiments, a sidewall angle of the TSV openings 720 can range from 80 to 90°, e.g., 80, 85, 88, 89 or 90°, including ranges between any of the foregoing values.

Figure 10A:
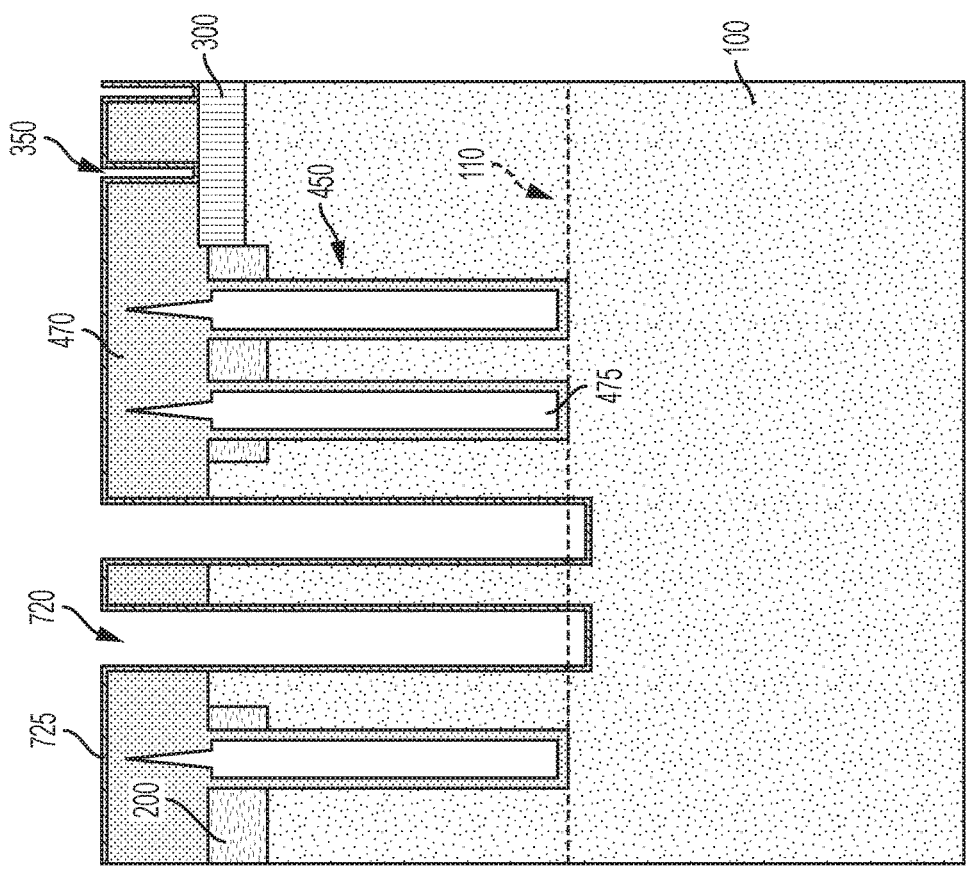
FIG. 10A depicts removal of the further hard mask and the formation of a conformal liner within the device contact openings and the through-substrate via openings.
Figure 10B:
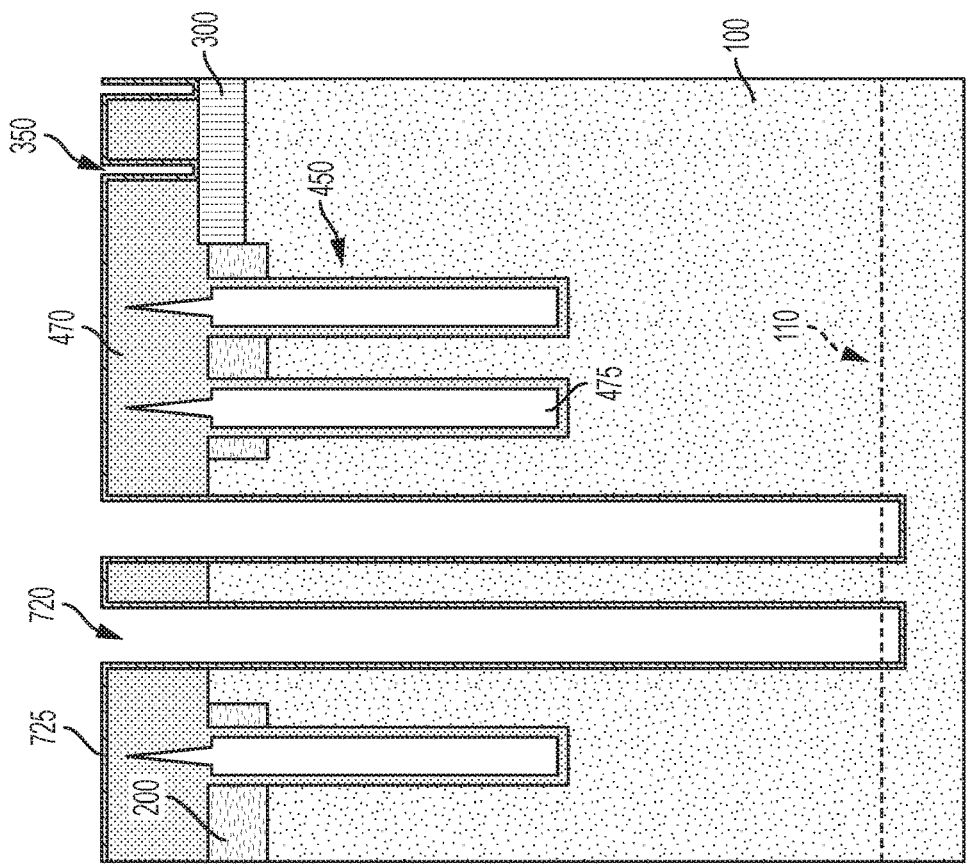
FIG. 10B depicts removal of the further hard mask and the formation of a conformal liner within the device contact openings and the through-substrate via openings.

Following removal of further hard mask 715, FIGS. 10A and 10B depict the structures of FIGS. 9A and 9B after a conformal liner 725 is formed over the contact level dielectric layer 470 and within both TSV openings 720 and device contact openings 350. The conformal liner 725 may serve to prevent the (later-formed) conductive material contained within the completed TSVs 750 and conductive contacts 360 from diffusing into or through the contact level dielectric layer 470 and/or substrate 100. Conformal liner 725 may also serve as an adhesion layer that improves the bonding of the conductive fill layer and the conductive contact layer of the TSVs and conductive contacts, respectively.

Depending on device requirements and TSV design parameters, the conformal liner 725 may include any one of a number of suitable adhesion-promoting or barrier layer materials such as, for example, tantalum (Ta), tantalum nitride (TaN), titanium (Ti), titanium nitride (TiN), titanium silicon nitride (TiSiN), tungsten nitride (WN), and the like, as well as combinations and multilayers thereof. The thickness of the conformal liner may range from 2 to 20 nm, depending on the material type and deposition method used to form the liner 725. In certain embodiments, conformal liner 725 may provide isolation from radio frequencies, which enables placement of the TSVs closer to the electronic device 300.

After formation of the conformal liner 725, a conductive fill layer 730 may be formed over the substrate 100 so as to completely fill the device contact openings 350 and the TSV openings 720, as shown in FIGS. 11A and 11B. By way of example, the device contact openings 350 and the TSV openings 720 may be metallized in a single metallization step to form TSV structures 750 and conductive contacts 360. The conductive fill layer 730 may include tungsten or a tungsten alloy, for example, or any other suitable conductive material such as copper or a copper alloy.

In certain embodiments, conductive fill layer 730 may be formed using an electrochemical plating processing in order to substantially fill the device contact openings 350 and the TSV openings 720. In other embodiments, an electroless plating process may be used. Additionally, and depending on the type of material used for the conformal liner 725, a seed layer (not shown) may be formed over the conformal liner 725 prior to forming conductive fill layer 730.

Figure 12A:
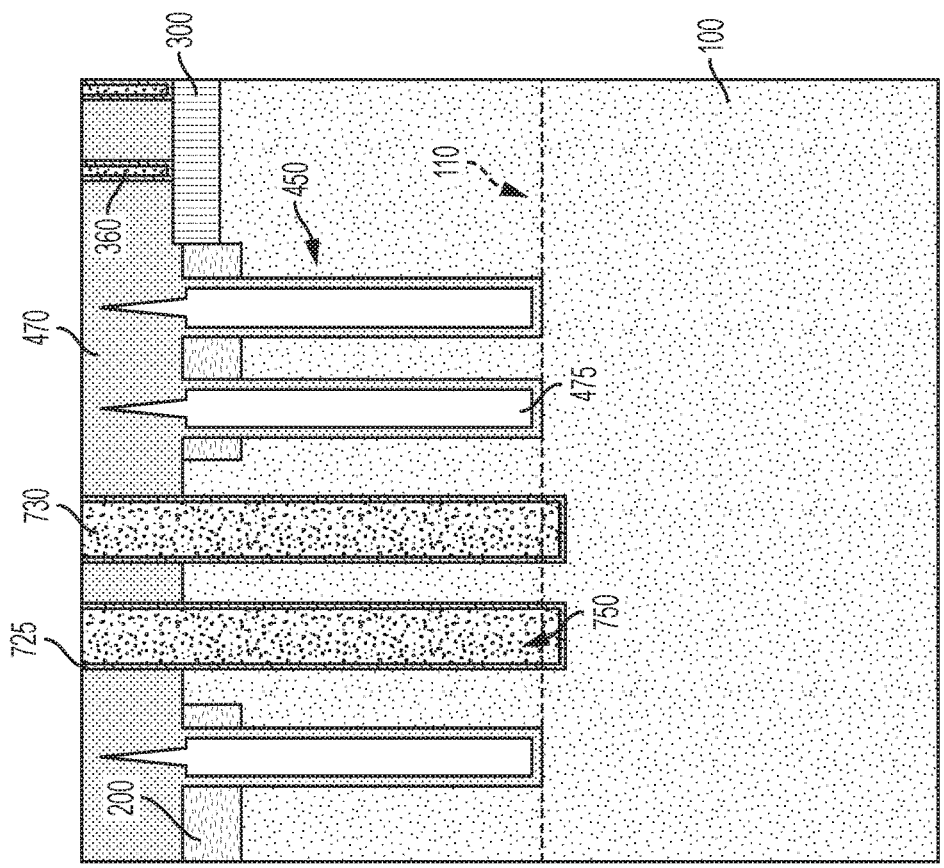
FIG. 12A shows the post-planarization formation of metallized through-substrate via openings according to one embodiment.
Figure 12B:
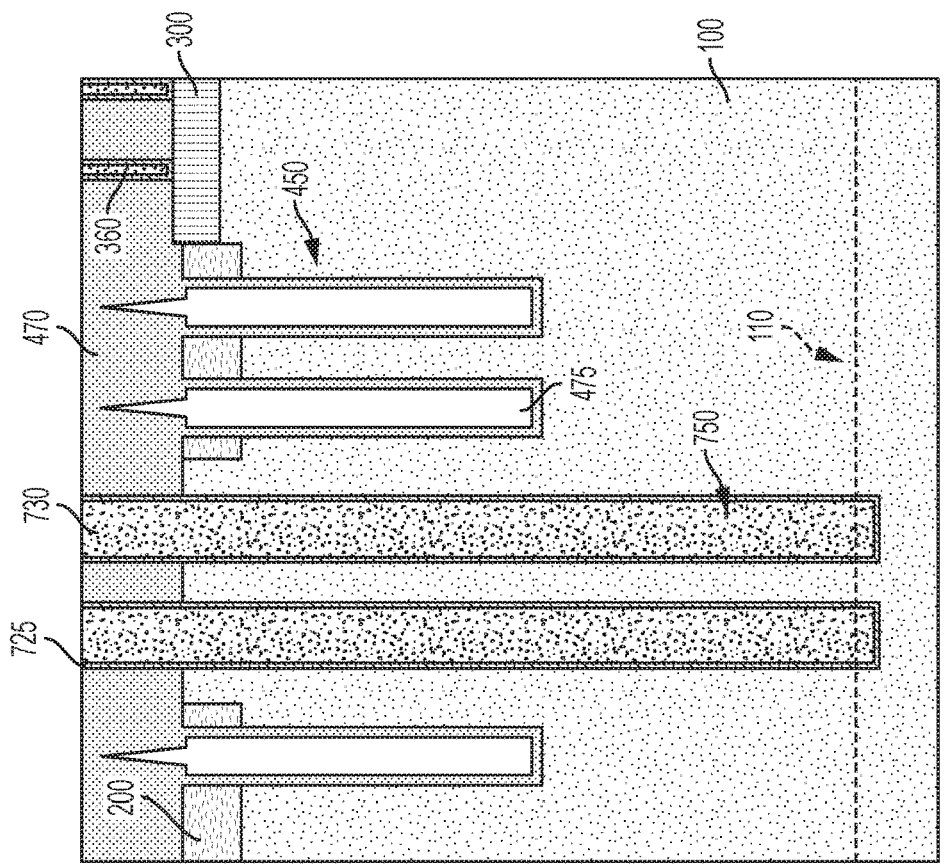
FIG. 12B shows the post-planarization formation of metallized through-substrate via openings according to a further embodiment.

A CMP step may be used to remove the conductive fill layer overburden, as shown in FIG. 12A and FIG. 12B using the contact level dielectric layer 470 as a stop layer. In certain embodiments, the CMP step does not substantially remove the contact level dielectric layer 470, and hence does not expose air gaps 475.

Figure 13A:
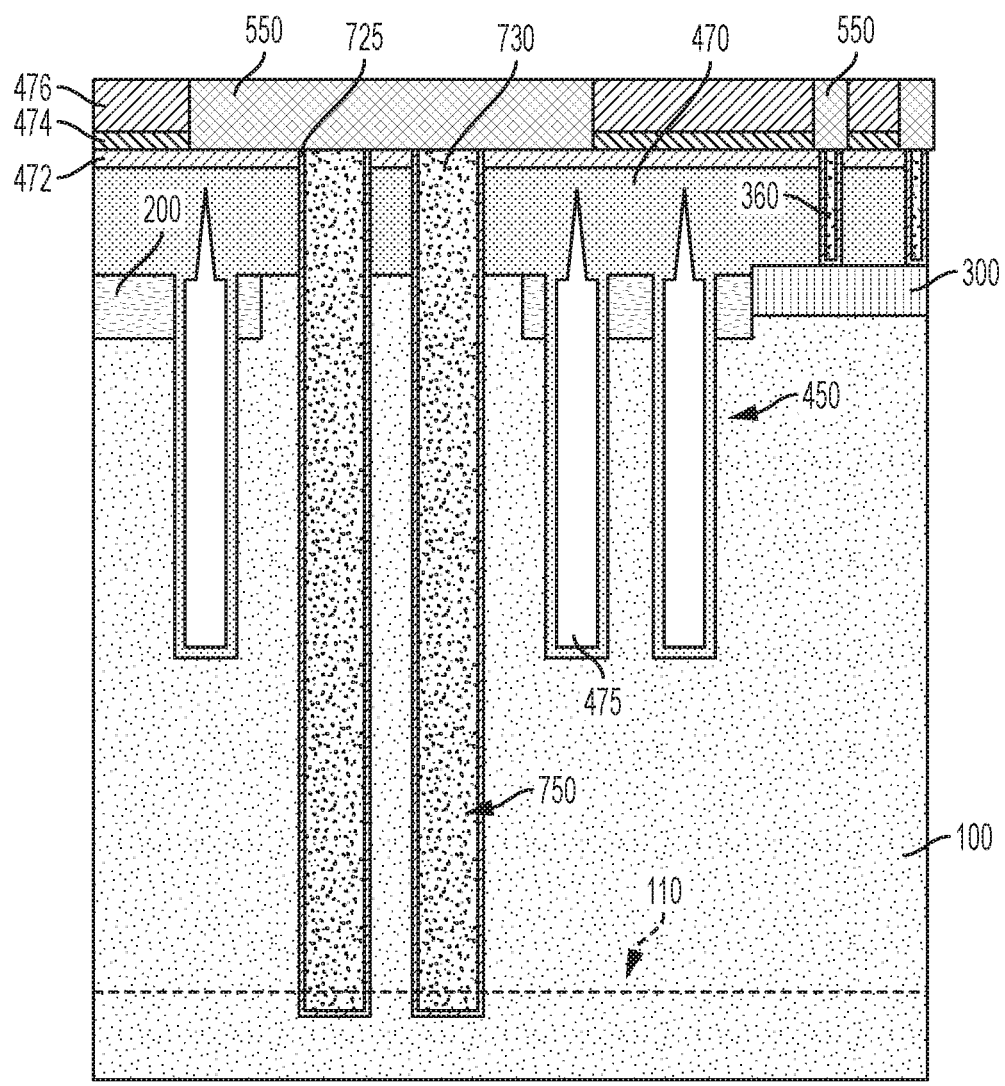
FIG. 13A depicts the formation of a back-end-of-the-line (BEOL) wiring architecture over the structure of FIG. 12A and the location of a backside grind interface.
Figure 13B:
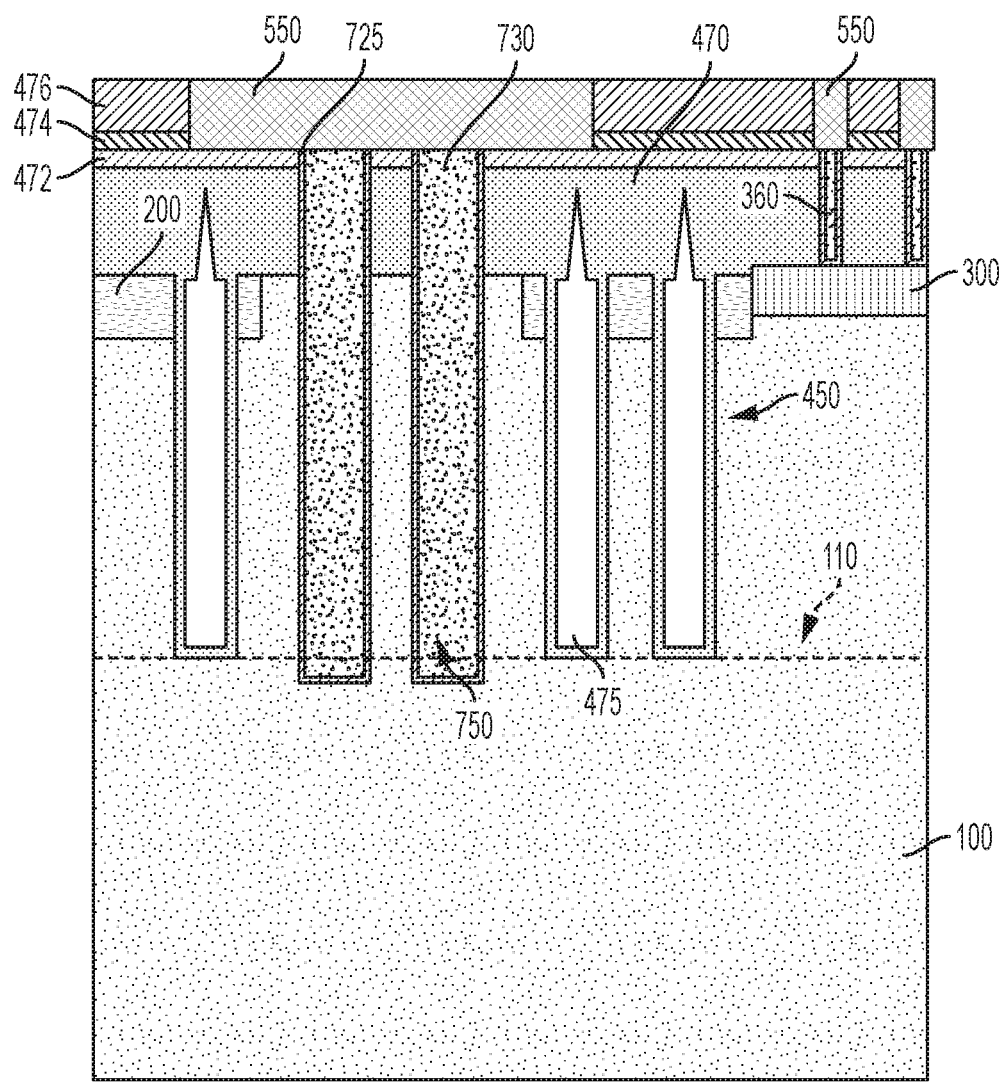
FIG. 13B depicts the formation of a back-end-of-the-line (BEOL) wiring architecture over the structure of FIG. 12B and the location of a backside grind interface.

Referring to FIG. 13A and FIG. 13B, after completion of the planarization process, additional processing of the front side of the substrate 100 may be performed, including the formation of a metallization architecture in contact with conductive fill layer 730 and the conductive contacts 360.

In certain embodiments, one or more interlayer dielectric (ILD) layers, e.g., ILD layers 472, 474, 476, may be formed over the device 300 and over contact level dielectric layer 470 so as to electrically isolate the respective circuit elements. The ILD layers 472, 474, 476 may include, for example, silicon dioxide, silicon nitride, silicon oxynitride, and the like, as well as combinations thereof. In further embodiments, depending on the device design and overall process flow requirements, one or more of the dielectric layers 472, 474, 476 may include a low-k dielectric material, such as porous silicon dioxide, an organosilicate, an organic polyimide, and the like.

Trench openings may be formed in one or more of the ILD layers 472, 474, 476, which may thereafter be filled with a conductive material to form conductive lines or wires 550. Various ones of the metal lines 550 may be in electric contact with the conductive contacts 360 and with the through-substrate vias 750.

Thereafter, the substrate 100 may be thinned from the backside so as to reduce the thickness of the substrate, and expose the bottom surfaces of the TSVs 750 in preparation for substrate bonding and 3D integrated circuit assembly, for example.

Figure 14A:
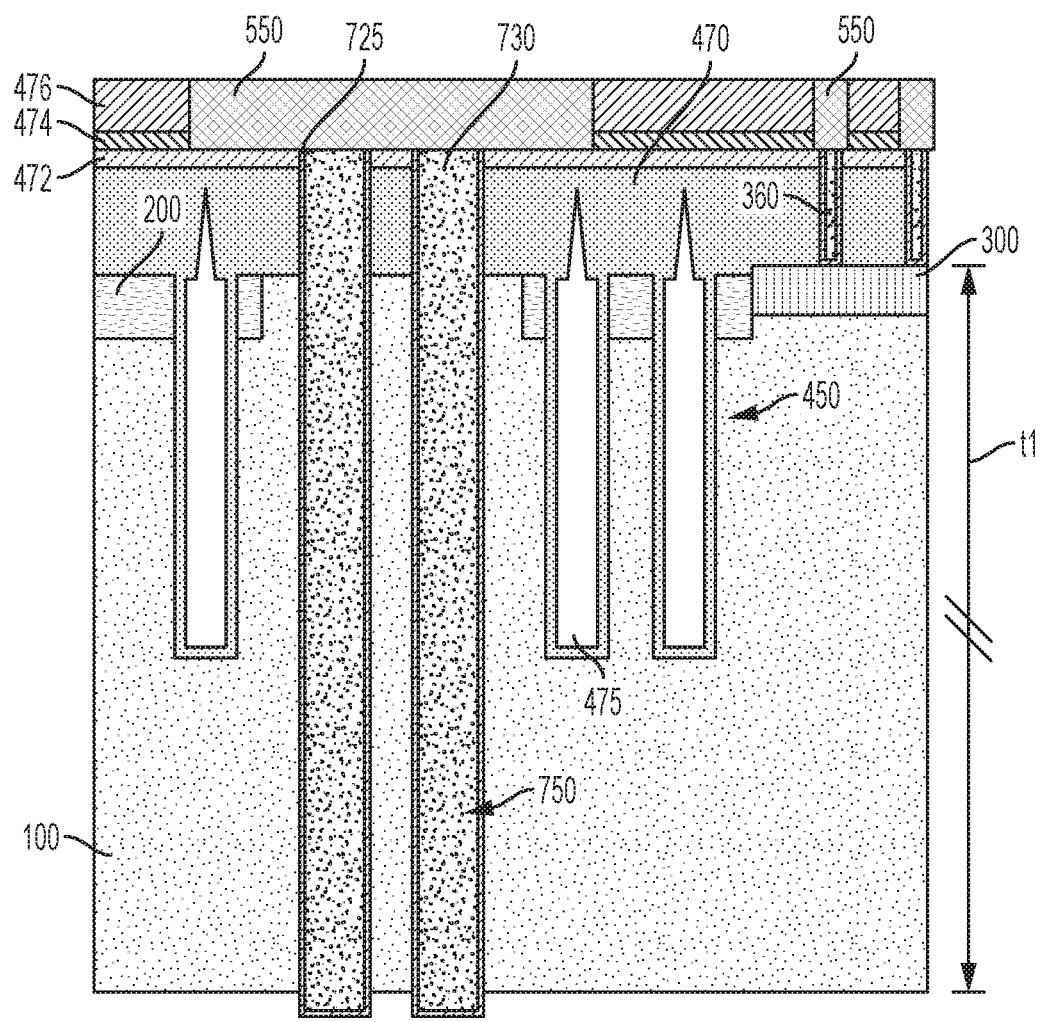
FIG. 14A depicts removal of a portion of the backside of the substrate to expose the metallization within the through-substrate vias.
Figure 14B:
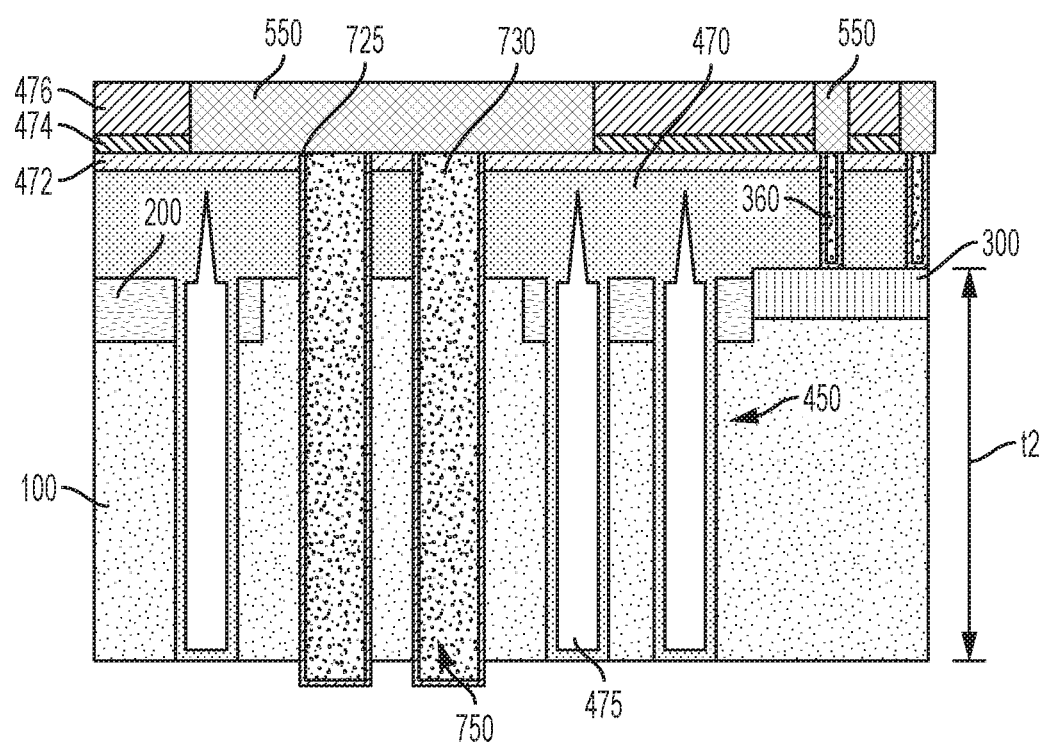
FIG. 14B depicts removal of a portion of the backside of the substrate to expose the deep trench isolation structures and the metallization within the through-substrate vias.

In the embodiment of FIG. 14A, the backside grinding reveals TSVs 750 without revealing DTI structures 450, while in the embodiment of FIG. 14B, the backside grinding reveals TSVs 750 and DTI structures 450, i.e., contact level dielectric layer 470 within deep trench openings 420. In certain embodiments, a bottom surface of the TSV conductive fill layer 730 may extend below a bottom surface of the substrate after grinding due to dishing of the substrate.

Figure 15A:
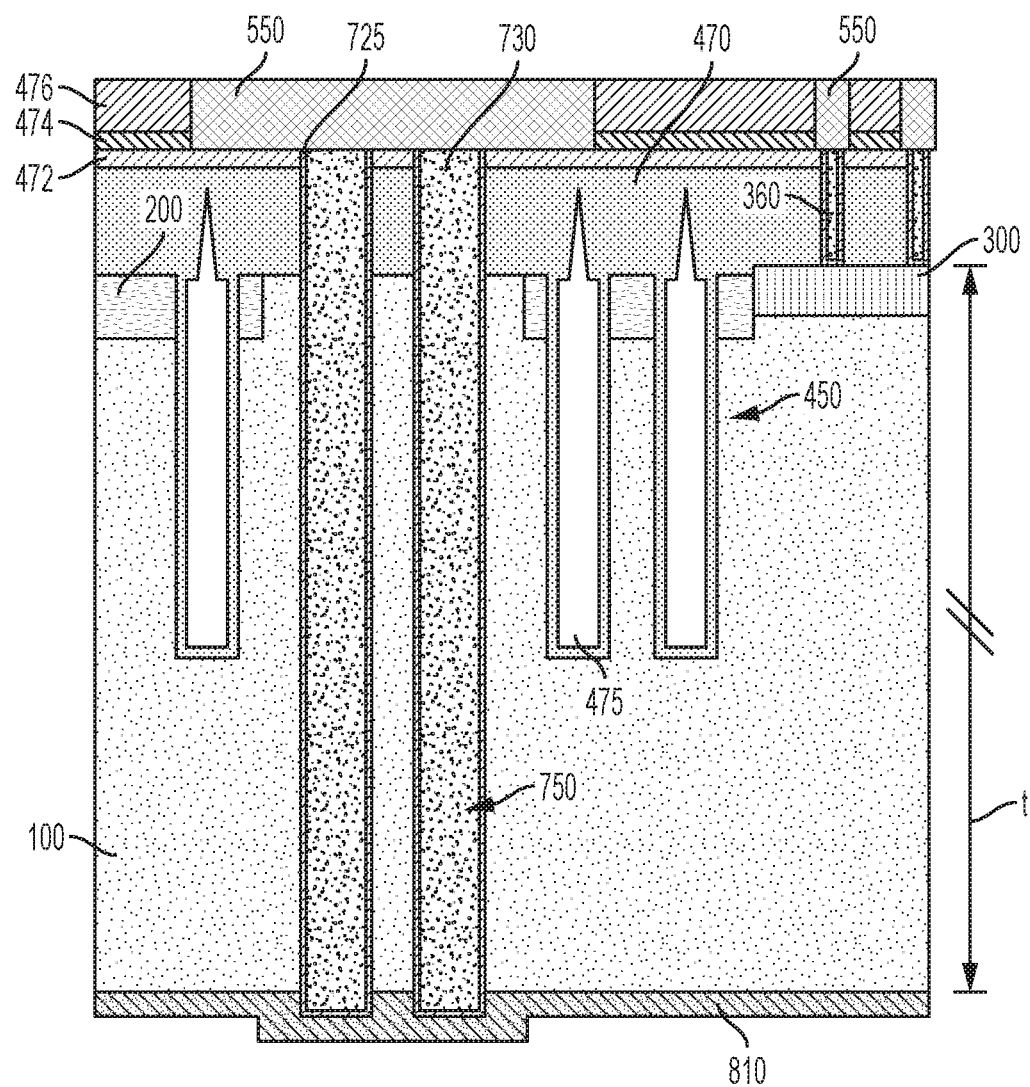
FIG. 15A shows the structure of FIG. 14A following the formation of a metallization layer over the backside of the substrate in electrical contact with the through-substrate vias.

Referring to FIG. 15A, a metallization layer 810 is formed over a backside of the substrate 100, and in electrical contact with through-substrate vias 750. In the FIG. 15A embodiment, the TSVs 750 extend through the contact level dielectric layer 470, between adjacent STI layers 200, and entirely through the substrate 100, whereas first and second deep trench isolation structures 450a, 450b extend only partially through the substrate 100. After grinding, the substrate 100 in the embodiment of FIG. 15A may have a thickness (t) of 150 to 300 microns.

Figure 15B:
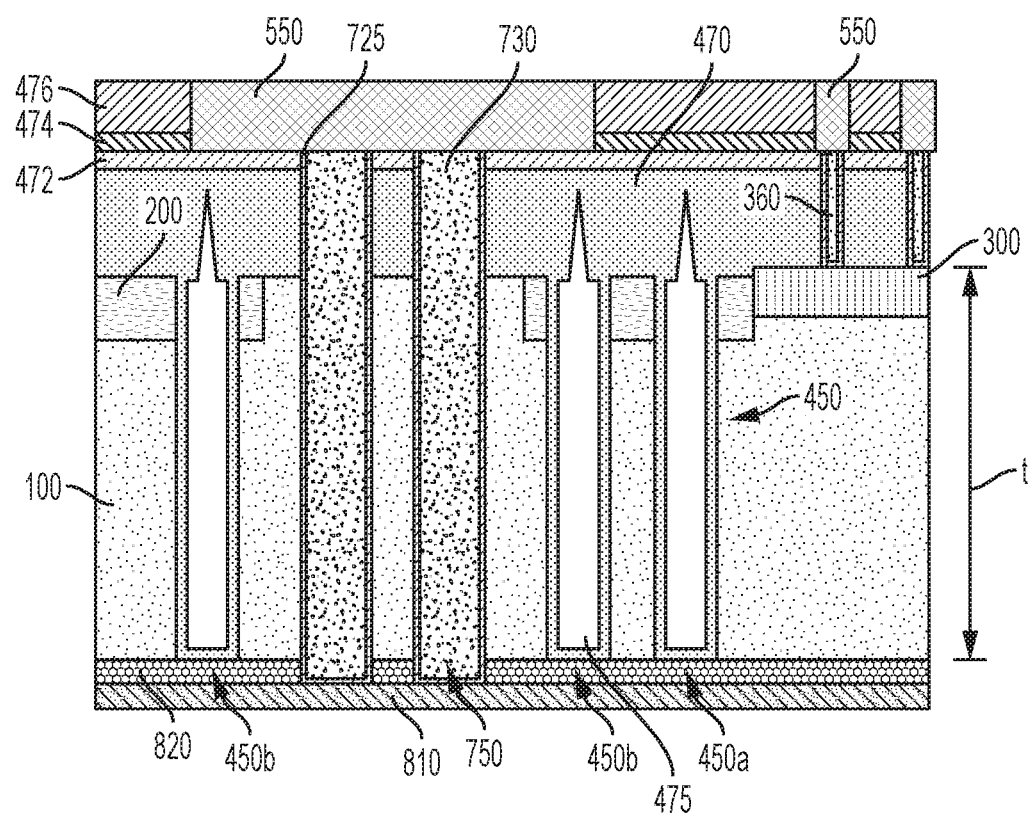
FIG. 15B shows the structure of FIG. 14B following the deposition of a passivation layer over the backside of the substrate and the deposition of a metallization layer over the passivation layer and in electrical contact with the through-substrate vias.

Referring to FIG. 15B, TSVs 750 extend through the contact level dielectric layer 470 between adjacent STI layers 200, and entirely through the substrate 100. First and second deep trench isolation structures 450a, 450b extend through the STI layers 200 and also extend completely through the substrate 100. In the embodiment of FIG. 15B, a passivation layer 820 is formed over the backside of the substrate, i.e., directly over a bottom surface of first and second deep trench isolation structures 450a, 450b.

A polishing step or etching step may be used to remove the passivation layer 820 from over the protruding TSVs, whereafter a metallization layer 810 may be formed over the passivation layer 820, and in electrical contact with TSVs 750. After grinding, the substrate 100 of the embodiments of FIG. 15B may have a thickness (t) of 50 to 100 microns.

With reference now to FIGS. 16-21, illustrated are example process flows for the co-integration of through-substrate via and deep trench isolation structures according to further embodiments. FIGS. 16A-21A show the formation of a dual-layer contact level dielectric architecture in conjunction with a copper-first metallization scheme, while FIGS. 16B-21B show the formation of a single-layer contact level dielectric architecture in conjunction with an aluminum-first metallization scheme. The dual-layer and single-layer contact level dielectric process flows may be conducted separately, i.e., on different substrates, or concurrently on the same substrate.

Referring to FIG. 16A and FIG. 16B, a hard mask 410 is formed over substrate 100, including STI layer 200 and device 300 and, using conventional photolithography and etching techniques, the hard mask 410 is patterned to form openings that extend through the hard mask exposing STI layer 200.

Referring to FIG. 17A and FIG. 17B, following patterning of the hard mask 410, the STI layer 200 and substrate 100 are etched using the hard mask 410 as an etch mask to simultaneously form a number of deep trench openings 420 and TSV openings 720 that extend through the STI layer 200 and into the substrate 100. In certain embodiments, the etch process to form the deep trench openings 420 and TSV openings 720 may be a substantially anisotropic etch process, such as a deep reactive ion etch (RIE).

The trench openings 420 and the TSV openings 720 can have a range of widths and depths. For instance, each trench opening 420 and TSV opening 720 may independently have a width (w1, w2, respectively) of 0.5 to 5 microns, e.g., 0.5, 1, 2, 3, 4 or 5 microns, including ranges between any of the foregoing values, and a depth of 50 to 200 microns, e.g., 50, 75, 100, 125, 150, 175 or 200 microns, including ranges between any of the foregoing values, although deeper trench and TSV openings are contemplated. In certain embodiments, a width (w2) of the TSV openings 720 may be three to five times a width (w1) of the trench openings 420.

Notwithstanding the simultaneous etching step, the depth of the trench openings 420 and TSV openings 720 can be independently controlled by controlling the critical dimension (width) of the corresponding openings in the hard mask 410. In various embodiments the trench openings 420 are shallower than the TSV openings 720 as a consequence of the openings in the hard mask 410 over the trench openings 420 being narrower than the openings in the hard mask 410 over the TSV openings 720.

Referring still to FIG. 17A and FIG. 17B, after the trench openings 420 and TSV openings 720 have been formed, and following removal of the hard mask 410, a first contact level dielectric layer 470 is formed over substrate 100, e.g., over STI layer 200 and device 300, and conformally within the trench and TSV openings 420, 720 to line the trench and TSV openings 420, 720. In certain embodiments, the first contact level dielectric layer 470 may pinch off to form an air gap 475 within the trench openings 420 between opposing sidewalls thereof to define DTI structures 450. Thus, DTI structures include the first contact level dielectric layer 470 and optionally one or more airgaps within the trench openings 420.

In connection with the dual-contact level dielectric embodiment of FIG. 17A, complete pinch off of the TSV openings 720 is avoided, although the first contact level dielectric layer 470 may include a taper region proximate to a top of the TSV openings 720, while in the single-contact level dielectric embodiment of FIG. 17B, the first contact level dielectric layer 470 pinches off over both the trench openings 420 and TSV openings 720. In each of the dual-contact level and single-contact level embodiments, the portion of the first contact level dielectric layer 470 forming a lining with the TSV openings is adapted to function as an isolation layer for later-deposited via metallization.

Figure 18A:
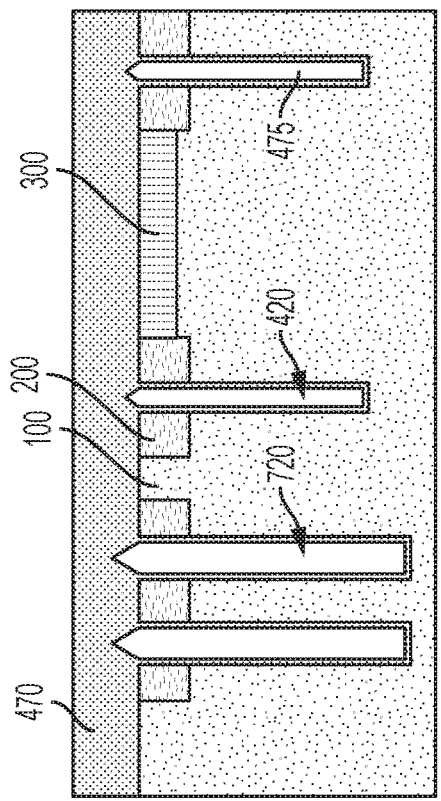
FIG. 18A shows metallization of the lined through-substrate via openings and the deposition of a contact level dielectric layer over the substrate and over the metallized TSVs.

Referring to FIG. 18A, a conductive fill layer 730 may be formed over the substrate 100 to fill the TSV openings 720. The conductive fill layer 730 may include tungsten or a tungsten alloy, for example, or any other suitable conductive material such as copper or a copper alloy. A CMP step may be used to remove the conductive fill layer overburden, e.g., using the first contact level dielectric layer 470 as a stop layer. A second contact level dielectric 471 may be formed over the planarized structure to encapsulate the metallized TSV openings 720. The second contact level dielectric layer 471 may be formed using chemical vapor deposition (CVD) or atomic layer deposition (ALD), for example, and may include silicon dioxide, or a borophosilicate glass (BPSG). A method for forming a BPSG layer by atmospheric pressure chemical vapor deposition (APCVD) uses ozone and TEOS as precursor gases. The second contact level dielectric layer 471 and the first contact level dielectric layer 470 may be the same or different.

Figure 18B:
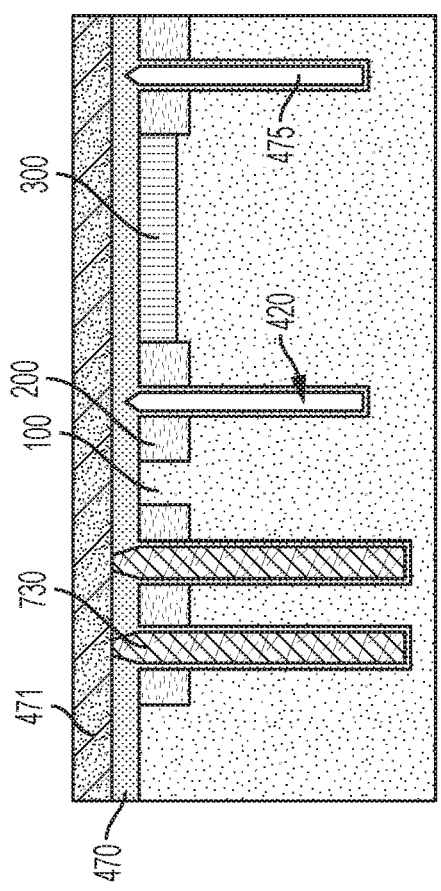
FIG. 18B depicts the deposition of a contact level dielectric layer over the substrate and over the lined through-substrate via openings.

At this stage of manufacture, on the other hand, the architecture of the single-contact level dielectric device of FIG. 18B is unchanged with respect to FIG. 17B. As shown in FIG. 18B, prior pinch off of the contact level dielectric layer 470 prevents deposition of the conductive fill layer 730 into the TSV openings 720, such as in embodiments where the single-contact level dielectric structure (FIG. 18B) and the dual-contact level dielectric structure (FIG. 18A) are co-integrated onto the same substrate 100.

Figure 19A:
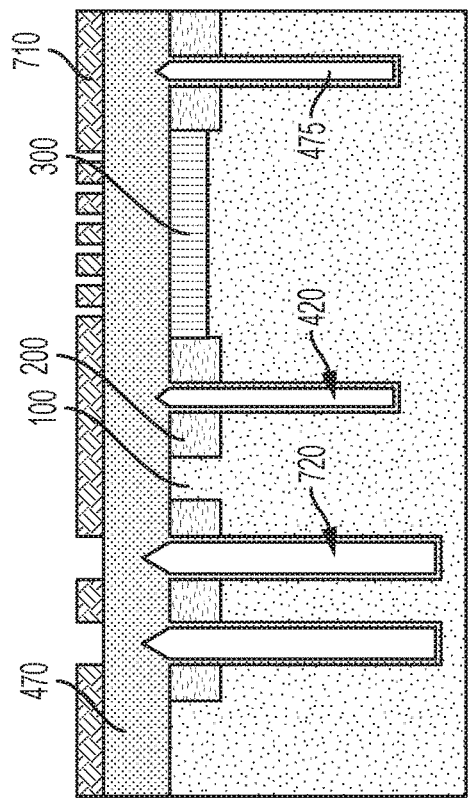
FIG. 19A shows the formation and patterning of a hard mask over the contact level dielectric layer of FIG. 18A according to certain embodiments.
Figure 19B:
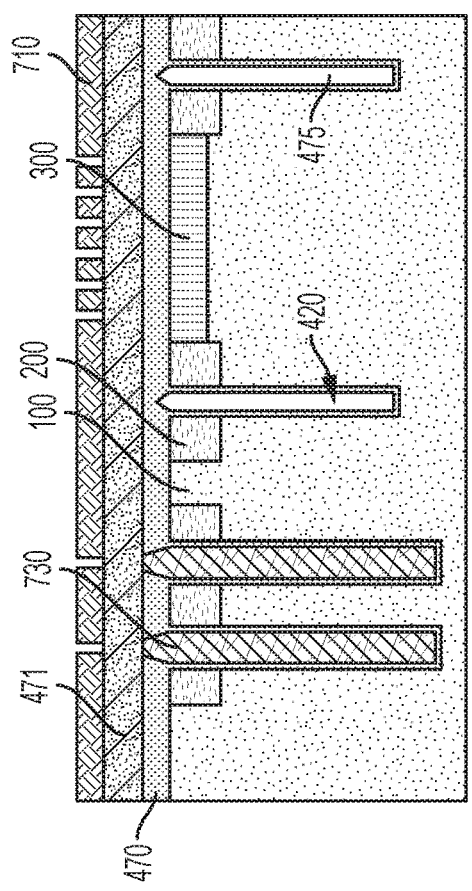
FIG. 19B shows the formation and patterning of a hard mask over the contact level dielectric layer of FIG. 19A according to further embodiments.

Referring to FIG. 19A, a hard mask 710 is formed above the second contact level dielectric layer 471, whereas in FIG. 19B a hard mask layer 710 is formed over the first contact level dielectric layer 470, and openings are formed in the hard mask 710 using conventional photolithography. The mask openings over as yet un-filled TSVs (FIG. 19B) are wider than the mask openings over previously-filled TSVs (FIG. 19A) to enable subsequent metallization of the TSVs in the single-contact level dielectric structure.

Thereafter, using the patterned hard mask 710 as an etch mask, and referring to FIG. 20A and FIG. 20B, the second contact level dielectric layer 471 (FIG. 20A) and the first contact level dielectric layer 470 (FIG. 20B) is etched to provide device contact openings 350 and TSV contact openings 740. As will be appreciated, in the dual-contact process flow, the TSV contact openings 740 expose the previously-metallized TSVs, while in the single-contact level process flow, the TSV contact openings 740 expose the lined TSV openings 720. Thus, a metallization step in the dual-contact level process flow (FIG. 20A) forms contacts to both the previously-metallized TSVs and the electronic device 300, while the metallization step in the single-contact level process flow (FIG. 20B) fills the TSV openings 720 and also forms contacts to the metallized TSVs and to the electronic device 300. A CMP step may be used to remove the metallization overburden. Referring to FIG. 20A, the top of the metalized TSV decreases in width, e.g. tapers, as it emerges over a front side of the substrate 100. Referring to FIG. 20B, the top of the metalized TSV broadens, e.g. increases in width, as it emerges over a front side of the substrate 100.

Referring to FIG. 21A and FIG. 21B, metal lines 550 are formed over the planarized structure in contact with metallization to the TSVs as well as to the electronic device 300. In the dual-contact level dielectric embodiment shown in FIG. 21A, copper metal lines 550 may be formed by initially depositing a barrier architecture 520 including an etch stop layer 522 and an oxide layer 524. Openings are formed in the barrier architecture 520, and copper metal lines 550 are formed therein using electroplating, for example.

In the single-contact level dielectric embodiment shown in FIG. 21B, aluminum-containing metal lines 550 may be formed directly over the TSV and electronic device metallization by successive steps of deposition and patterning. In certain embodiments, the aluminum-containing metal lines 550 include a barrier layer 532, a layer of aluminum metal 534 overlying the barrier layer 532, and a further barrier layer 536 overlying the layer of aluminum metal 534. Barrier layers 532, 536 may include titanium or titanium nitride, for example.

As described above with reference to FIGS. 14A, 14B, 15A and 15B, a backside grind module may be used to enable substrate bonding and 3D assembly of the structures illustrated in FIG. 21A and FIG. 21B.

As used herein, the singular forms "a," "an" and "the" include plural referents unless the context clearly dictates otherwise. Thus, for example, reference to a "deep trench" includes examples having two or more such "deep trenches" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a through-substrate vias that comprise tungsten include embodiments where a through-substrate via consists essentially of tungsten and embodiments where a through-substrate via consists of tungsten.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A semiconductor chip comprising:
   a high resistivity semiconductor substrate;
   an electronic device formed over a front side of the substrate;
   a through-substrate via laterally spaced from the electronic device;
   a first deep trench isolation structure extending at least partially through the substrate and laterally spaced from and surrounding the electronic device; and
   a second deep trench isolation structure extending at least partially through the substrate and laterally spaced from and surrounding the through-substrate via,
   wherein a portion of the first deep trench isolation structure is contiguous with a portion of the second deep trench isolation structure.

2. The semiconductor chip of claim 1, wherein the high resistivity semiconductor substrate has a bulk resistivity of greater than 1000 ohm-cm.

3. The semiconductor chip of claim 1, further comprising an air gap independently within each of the first deep trench isolation structure and the second deep trench isolation structure.

4. The semiconductor chip of claim 3, wherein the air gap within each of the first deep trench isolation structure and the second deep trench isolation structure independently extends above a top surface of the substrate.

5. The semiconductor chip of claim 1, wherein the first deep trench isolation structure and the second deep trench isolation structure independently extend vertically entirely through the substrate.

6. The semiconductor chip of claim 1, further comprising a metallization layer disposed over a back side of the substrate.

7. The semiconductor chip of claim 6, wherein the through-substrate via is metalized and the metallization layer is in electrical contact with the metalized through-substrate via.

8. The semiconductor chip of claim 6, further comprising a passivation layer disposed over the back side of the substrate, where the metallization layer is disposed over the passivation layer.

9. The semiconductor chip of claim 8, wherein the passivation layer is in direct contact with the first deep trench isolation structure and the second deep trench isolation structure.

10. The semiconductor chip of claim 1, wherein a distance between the electronic device and the through-substrate via is less than 25 microns.

11. The semiconductor chip of claim 1, further comprising a shallow trench isolation layer disposed between the first deep trench isolation layer and the electronic device and laterally adjacent to and surrounding the electronic device.

12. A semiconductor chip comprising:
a high resistivity semiconductor substrate;
an electronic device formed over a front side of the substrate;
a metallization layer disposed over a back side of the substrate;
a through-substrate via laterally spaced from the electronic device;
a first deep trench isolation structure extending at least partially through the substrate and laterally spaced from and surrounding the electronic device;
a second deep trench isolation structure extending at least partially through the substrate and laterally spaced from and surrounding the through-substrate via; and
a first air gap independently within the first deep trench isolation structure and a second air gap independently within the second deep trench isolation structure,
wherein a portion of the first deep trench isolation structure is contiguous with a portion of the second deep trench isolation structure.

13. The semiconductor chip of claim 12, wherein the high resistivity semiconductor substrate has a bulk resistivity of greater than 1000 ohm-cm.

14. The semiconductor chip of claim 12, wherein the first air gap within the first deep trench isolation structure and the second air gap within the second deep trench isolation structure independently extend above a top surface of the substrate.

15. The semiconductor chip of claim 12, wherein the first deep trench isolation structure and the second deep trench isolation structure independently extend vertically entirely through the substrate.

16. The semiconductor chip of claim 12, further comprising a passivation layer disposed over the back side of the substrate, where the metallization layer is disposed over the passivation layer, wherein the passivation layer is in direct contact with the first deep trench isolation structure and the second deep trench isolation structure.

17. The semiconductor chip of claim 12, wherein a distance between the electronic device and the through-substrate via is less than 25 microns.

18. The semiconductor chip of claim 12, further comprising a shallow trench isolation layer disposed between the first deep trench isolation layer and the electronic device and laterally adjacent to and surrounding the electronic device.

19. A semiconductor chip comprising:
a high resistivity semiconductor substrate;
an electronic device formed over a front side of the substrate;
a through-substrate via laterally spaced from the electronic device;
a first deep trench isolation structure extending at least partially through the substrate and laterally spaced from and surrounding the electronic device; and
a second deep trench isolation structure extending at least partially through the substrate and laterally spaced from and surrounding the through-substrate via,
wherein the first deep trench isolation structure and the second deep trench isolation structure independently extend vertically entirely through the substrate.

* * * * *